United States Patent
Chu et al.

(10) Patent No.: US 11,609,671 B2
(45) Date of Patent: Mar. 21, 2023

(54) TOUCH DISPLAY APPARATUS

(71) Applicant: LG Display Co., Ltd., Seoul (KR)

(72) Inventors: Dong Il Chu, Gimpo-si (KR); Min Joo Kim, Seoul (KR); Sang Hyuk Won, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/531,226

(22) Filed: Nov. 19, 2021

(65) Prior Publication Data
US 2022/0164066 A1 May 26, 2022

(30) Foreign Application Priority Data

Nov. 23, 2020 (KR) .......................... 10-2020-0157681
Oct. 12, 2021 (KR) .......................... 10-2021-0134971

(51) Int. Cl.
*G06F 3/041* (2006.01)
*H01L 27/32* (2006.01)
*G06F 3/044* (2006.01)

(52) U.S. Cl.
CPC ........ *G06F 3/0446* (2019.05); *G06F 3/04164* (2019.05); *G06F 2203/04111* (2013.01); *G06F 2203/04112* (2013.01)

(58) Field of Classification Search
None
See application file for complete search history.

(56) References Cited

U.S. PATENT DOCUMENTS

| | | | |
|---|---|---|---|
| 9,614,013 B2 | 4/2017 | Im et al. | |
| 2014/0225090 A1* | 8/2014 | Lee ........................ | H01L 51/56 |
| | | | 257/40 |
| 2014/0353470 A1 | 12/2014 | Kawanabe et al. | |
| 2016/0118446 A1* | 4/2016 | Im ........................ | H01L 27/3227 |
| | | | 257/40 |
| 2018/0323240 A1* | 11/2018 | Won .................... | H01L 27/3276 |
| 2019/0180946 A1 | 6/2019 | Kim et al. | |
| 2020/0411608 A1 | 12/2020 | Tang et al. | |
| 2021/0273014 A1 | 9/2021 | Uchida et al. | |

FOREIGN PATENT DOCUMENTS

| | | |
|---|---|---|
| CN | 110286796 A | 9/2019 |
| KR | 10-2016-0050177 A | 5/2016 |
| KR | 10-2018-0033074 A | 4/2018 |
| WO | WO 2020/105418 A1 | 5/2020 |

OTHER PUBLICATIONS

Combined Search and Examination Report, United Kingdom Intellectual Property Office Patent Application No. 2116823.2, dated May 24, 2022, 5 pages.

* cited by examiner

*Primary Examiner* — Krishna P Neupane
(74) *Attorney, Agent, or Firm* — Fenwick & West LLP

(57) ABSTRACT

A touch display apparatus is provided. The touch display apparatus may include a light-emitting device and a touch sensor. The touch sensor may be disposed on an encapsulating unit covering the light-emitting device. A photo-electric device may be disposed between the encapsulating unit and the touch sensor. The photo-electric device may be disposed outside an emission area in which the light-emitting device is disposed. A light-absorbing layer of the photo-electric device may overlap at least one of touch electrodes and bridges of the touch sensor. Thus, the touch display apparatus may increase the time that the touch display apparatus is used without external power source connected by using the electrical energy generated by the photo-electric device.

20 Claims, 23 Drawing Sheets

TOUCH DISPLAY APPARATUS

CROSS-REFERENCE TO RELATED APPLICATIONS

This application claims the benefit of priority of Republic of Korea Patent Application No. 10-2020-0157681 filed on Nov. 23, 2020, and Republic of Korea Patent Application No. 10-2021-0134971 filed on Oct. 12, 2021, each of which is hereby incorporated by reference in its entirety.

BACKGROUND

Field of Technology

The present disclosure relates to a touch display apparatus capable of increasing the time that the touch display apparatus is used without an external power source connected to the touch display apparatus.

Discussion of the Related Art

A display apparatus to display an image is provided in various forms for user's convenience. For example, the display apparatus may be used in a portable device, such as a smart phone and a tablet personal computer (PC).

The potable device may be used without external power source connected. For example, a battery may be built in the portable device for supplying power. Thus, in the portable device, the time that the display apparatus is used may be determined by the charge state of the battery.

The display apparatus may perform a specific program or apply a specific signal by a touch of a user and/or a tool. For example, the display apparatus may be a touch display apparatus including a touch sensor. A touch driving signal for sensing the touch of the user and/or the tool may be periodically applied to the touch sensor. Therefore, in the touch display apparatus of the portable device, the time that the touch display apparatus is used without the external power source connected may be greatly restricted.

SUMMARY

Accordingly, the present disclosure is directed to a touch display apparatus that substantially obviates one or more problems due to limitations and disadvantages of the related art.

An object of the present disclosure is to provide a touch display apparatus capable of increasing the using time without the external power source connected being connected to the touch display apparatus.

Another object of the present disclosure is to provide a touch display apparatus capable of improving the lifetime of the battery built in the portable device.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, there is provided a touch display apparatus comprising a device substrate. A light-emitting device is disposed on the device substrate. An encapsulating unit is disposed on the light-emitting device. The encapsulating unit includes at least one organic encapsulating layer and at least one inorganic encapsulating layer. A touch sensor is disposed on the encapsulating unit. A photo-electric device is disposed between the encapsulating unit and the touch sensor. The photo-electric device includes a light-absorbing layer overlapping with the touch sensor.

The touch sensor may include first touch electrodes, second touch electrodes, first bridges and second bridges. The first touch electrodes and the second touch electrodes may be disposed on the encapsulating unit. The first bridges may connect between the first touch electrodes. The second bridges may connect between the second touch electrodes.

The photo-electric device may include a lower electrode between the encapsulating unit and the light-absorbing layer. The lower electrode may overlap the first touch electrodes and the second touch electrodes. The first touch electrodes and the second touch electrodes of the touch sensor may function as an upper electrode of the photo-electric device.

The first touch electrodes and the second touch electrodes may have a transmittance higher than the lower electrode.

The first bridges and the second bridges may overlap the lower electrode.

The light-emitting device may be disposed on an emission area of the device substrate. Each of the first touch electrodes, the second touch electrodes and the lower electrode may have a mesh shape including an opening exposing the emission area.

The light-absorbing layer may include a semiconductor stack on the lower electrode and a barrier layer on the semiconductor stack.

The barrier layer may cover a side of the lower electrode.

The semiconductor stack may have a mesh shape overlapping with the lower electrode, the first touch electrodes and the second touch electrodes.

First touch routing lines may be extended from the first touch electrodes. Second touch routing lines may be extended from the second touch electrodes. A photo-electric routing line may be extended from the lower electrode. The first touch routing lines, the second touch routing lines and the photo-electric routing line may be disposed on the inorganic encapsulating layer covering a side of the organic encapsulating layer.

At least one of the first touch routing lines and the second touch routing lines may have a stacked structure of a first routing layer, a second routing layer and a third routing layer. The first routing layer may include the same material as the lower electrode. The second routing layer may include the same material as the first bridges. The third routing layer may include the same material as the second bridges.

The photo-electric routing line may have a single-layer structure made of the first routing layer or a multi-layer structure in which at least one of the second routing layer and the third routing layer is disposed on the first routing layer.

A touch insulating layer may be disposed on the second routing layer. The second routing layer may be partially exposed by a routing contact hole penetrating the touch insulating layer. The third routing layer may be connected to the second routing layer through the routing contact hole.

In another embodiment, there is provided a touch display apparatus comprising a device substrate. A bank insulating layer, light-emitting devices and an encapsulating unit are disposed on the device substrate. The bank insulating layer defines emission areas on the device substrate. The light-emitting devices are disposed on the emission areas of the device substrate. The encapsulating unit covers the bank insulating layer and the light-emitting devices. A photo-electric device is disposed on the encapsulating unit. The photo-electric device includes a lower electrode, a light-absorbing layer and an upper electrode, which are sequentially stacked. The photo-electric device overlaps the bank insulating layer. A touch insulating layer is disposed on the photo-electric device. First touch electrodes are disposed side by side on the touch insulating layer. Each of the first touch electrodes is connected to the first touch electrodes adjacent in a first direction by first bridges. The first bridges are disposed on the same layer as the upper electrode of the photo-electric device.

The first bridges may include the same material as the upper electrode.

Second touch electrodes may be disposed between the first touch electrodes. Each of the second touch electrodes may be connected to the second touch electrodes in a second direction by second bridges. The second direction may be perpendicular to the first direction. The second touch electrodes and the second bridges may be disposed on the same layer as the first touch electrodes.

The upper electrode may be disposed outside the first bridges and the second bridges. The first touch electrodes and the second touch electrodes may overlap the upper electrode.

The light-absorbing layer may include openings overlapping with the emission areas. Each of the openings may have a shape extending along an edge of the corresponding emission area.

The center of each opening may be the same as the center of the corresponding emission area.

The light-absorbing layer may include a region between the upper electrode and the emission areas.

The lower electrode and the light-absorbing layer may extend between the encapsulating unit and the first bridges.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 7A to 12A, 7B to 12B and 7C to 12C are views sequentially showing a method of forming the touch display apparatus according to the embodiment of the present disclosure;

DETAILED DESCRIPTION

Figure 1:
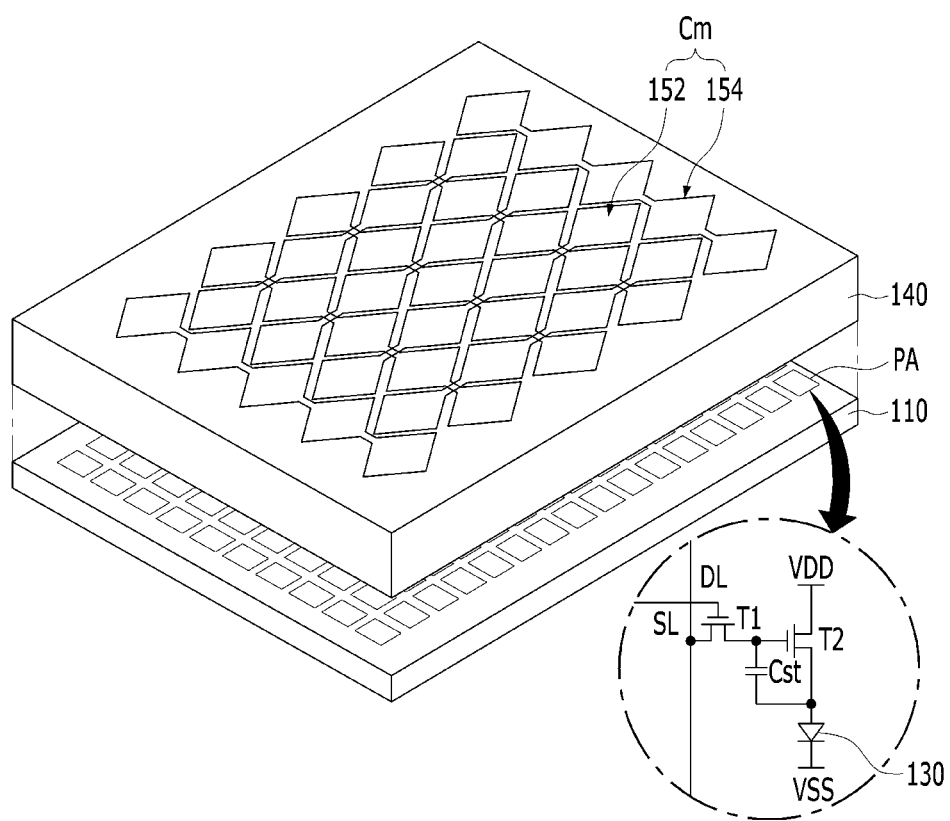
FIGS. 1 and 2 are views schematically showing a touch display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
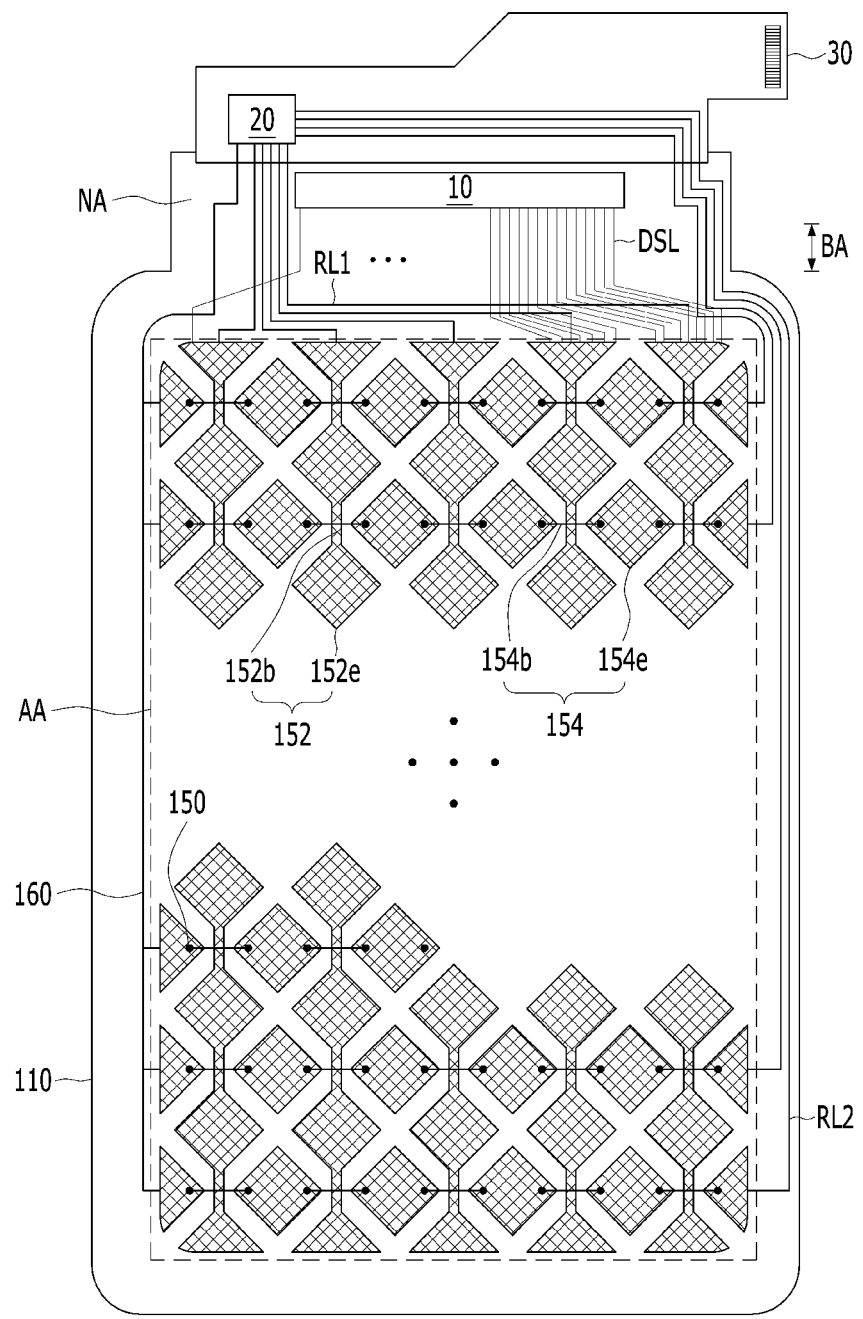
Figure 3:
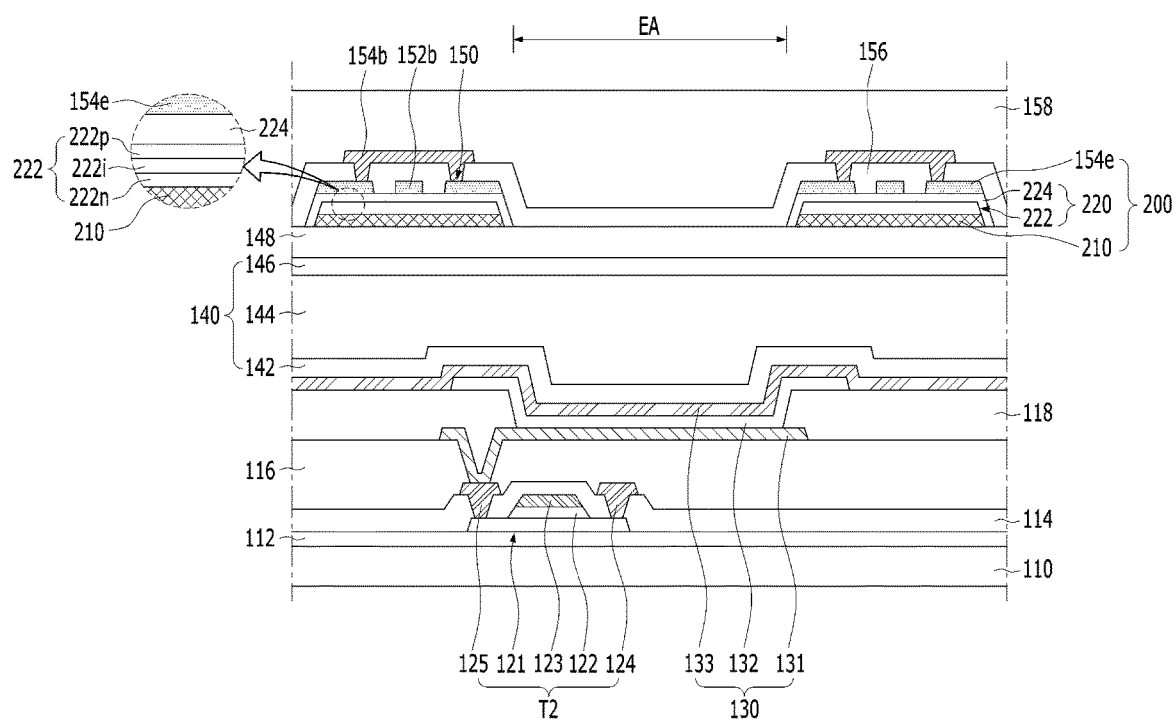
FIG. 3 is a view showing a cross-section of a pixel area in the touch display apparatus according to the embodiment of the present disclosure.
Figure 4:
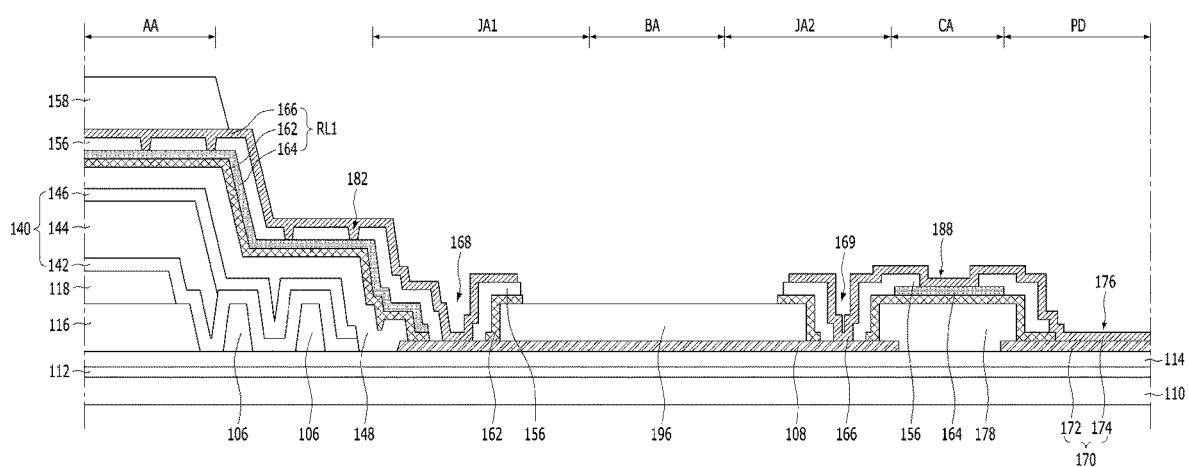
FIG. 4 is a view showing a cross-section of a peripheral of a bending region along in an extending direction of a second touch routing line in the touch display apparatus according to the embodiment of the present disclosure.
Figure 5:
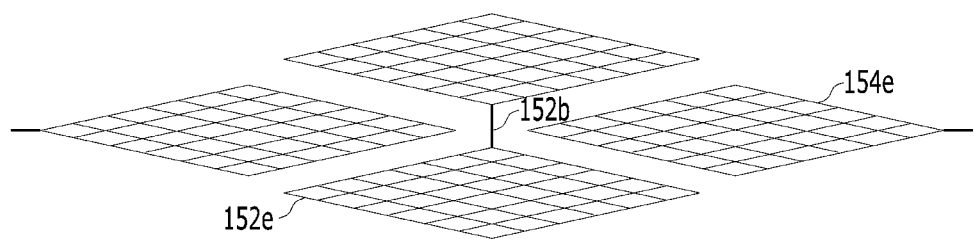
FIG. 5 is a view schematically showing a photo-electric device of the touch display apparatus according to the embodiment of the present disclosure.
Figure 5:
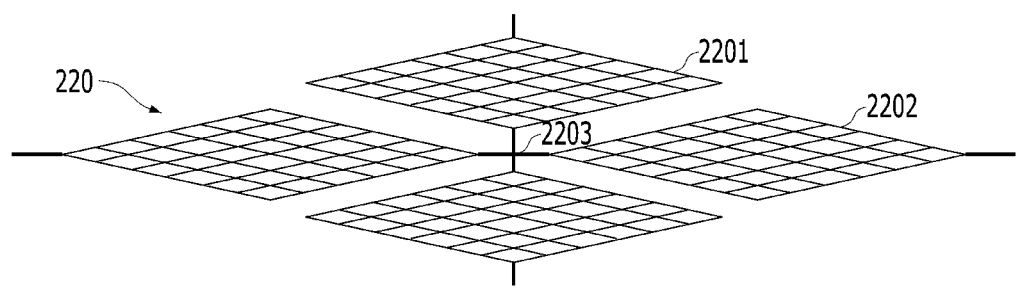
Figure 5:
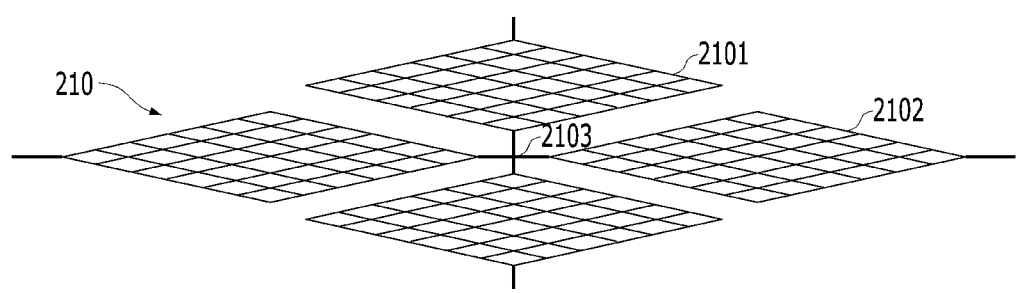
Figure 6:
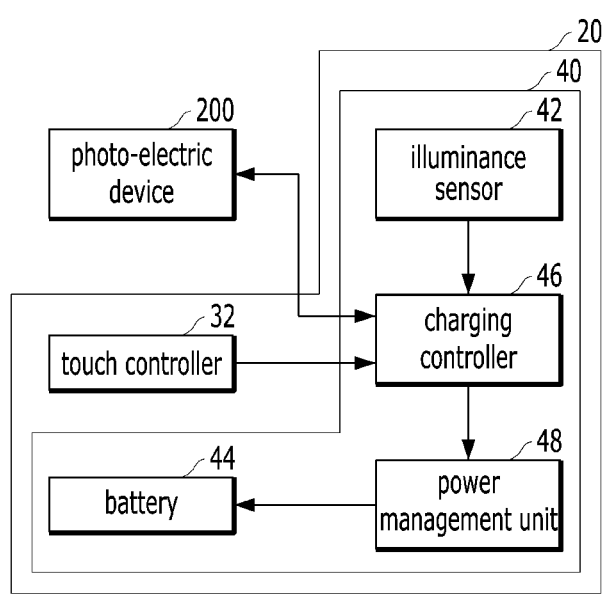
FIG. 6 is a view schematically showing a touch driving circuit of the touch display apparatus according to the embodiment of the present disclosure.

FIGS. 1 and 2 are views schematically showing a touch display apparatus according to an embodiment of the present disclosure. FIG. 3 is a view showing a cross-section of a pixel area in the touch display apparatus according to the embodiment of the present disclosure. FIG. 4 is a view showing a cross-section of peripheral of the bending region along in an extending direction of a second touch routing line in the touch display apparatus according to the embodiment of the present disclosure. FIG. 5 is a view schematically showing a photo-electric device of the touch display apparatus according to the embodiment of the present disclosure. FIG. 6 is a view schematically showing a touch driving circuit of the touch display apparatus according to the embodiment of the present disclosure.

Referring to FIGS. 1 to 6, the touch display apparatus according to the embodiment of the present disclosure may include a device substrate 110. The device substrate 110 may include an insulating material. For example, the device substrate 110 may include glass or plastic. The device substrate 110 may include a display area AA and a non-display area NA disposed outside the display area AA. For example, the non-display area NA may surround the display area AA.

The display area AA of the device substrate 110 may realize an image provided to a user. For example, a plurality of pixel area PA may be disposed in the display area AA of the device substrate 110. A display driving circuit 10 may be disposed on the non-display area NA of the device substrate 110. The display driving circuit 10 may be electrically connected to each pixel area PA through display signal lines DSL. The display driving circuit 10 may provide various signals to each pixel area PA for realizing the image. For example, the display driving circuit 10 may include a scan driver sequentially applying a scan signal and a data driver applying a data signal. The display signal lines DSL may include a scan line SL connecting between the scan driver and each pixel area PA and a data line DL connecting between the data driver and each pixel area PA.

The pixel areas PA may be disposed side by side. For example, the pixel areas PA may be arranged in a matrix shape. Each of the pixel areas PA may realize a specific color. For example, a pixel driving circuit and a light-emitting device 130 connected to the pixel driving circuit may be disposed in each pixel area PA.

The pixel driving circuit may provide a driving current corresponding to the data signal to the light-emitting device 130 according to the scan signal, during one frame. For example, the pixel driving circuit may include a switching thin film transistor T1, a driving thin film transistor T2 and a storage capacitor Cst.

The switching thin film transistor T1 may provide the data signal to the driving thin film transistor T2 according to the scan signal. The driving thin film transistor T2 may generate the driving current corresponding to the data signal. For example, the driving thin film transistor T2 may include a semiconductor pattern 121, a gate insulating layer 122, a gate electrode 123, a source electrode 124, and a drain electrode 125.

The semiconductor pattern 121 may include a semiconductor material. For example, the semiconductor pattern 121 may include at least one of amorphous silicon, polycrystalline silicon and oxide semiconductor. The semiconductor pattern 121 may include a source region, a drain region, and a channel region. The channel region may be disposed between the source region and the drain region. The source region and the drain region may have a lower resistance than the channel region.

The gate insulating layer 122 may be disposed on the semiconductor pattern 121. For example, the gate insulating layer 122 may overlap the channel region of the semiconductor pattern 121. The source region and the drain region of the semiconductor pattern 121 may be disposed outside the gate insulating layer 122. The gate insulating layer 122 may include an insulating material. For example, the gate insulating layer 122 may include an inorganic insulating material, such as silicon oxide (SiO) and silicon nitride (SiN).

The gate electrode 123 may be disposed on the gate insulating layer 122. For example, the gate electrode 123 may overlap the channel region of the semiconductor pattern 121. The gate electrode 123 may be insulated from the semiconductor pattern 121 by the gate insulating layer 122. For example, a side of the gate insulating layer 122 may be vertically aligned with a side of the gate electrode 123. The gate electrode 123 may include a conductive material. For example, the gate electrode 123 may include a metal, such as aluminum (Al), titanium (Ti), copper (Cu), molybdenum (Mo), tantalum (Ta), chromium (Cr) or tungsten (W). The channel region of the semiconductor pattern 121 may have an electric conductivity corresponding to a voltage applied to the gate electrode 123.

The source electrode 124 may include a conductive material. For example, the source electrode 124 may include a metal, such as aluminum (Al), titanium (Ti), copper (Cu), molybdenum (Mo), tantalum (Ta), chromium (Cr) or tungsten (W). The source electrode 124 may be insulated from the gate electrode 123. The source electrode 124 may be disposed on a layer different from the gate electrode 123. For example, an interlayer insulating layer 114 covering the gate electrode 123 may be disposed on the device substrate 110, and the source electrode 124 may be disposed on the interlayer insulating layer 114. The interlayer insulating layer 114 may include an insulating material. For example, the interlayer insulating layer 114 may include an inorganic insulating material, such as silicon oxide (SiO) and silicon nitride (SiN). The source electrode 124 may include a material different from the gate electrode 123.

The source electrode 124 may be electrically connected to the source region of the semiconductor pattern 121. For example, the interlayer insulating layer 114 may include a source contact hole partially exposing the source region of the semiconductor pattern 121. The source electrode 124 may be in direct contact with the source region of the semiconductor pattern 121 through the source contact hole.

The drain electrode 125 may include a conductive material. For example, the drain electrode 125 may include a metal, such as aluminum (Al), titanium (Ti), copper (Cu), molybdenum (Mo), tantalum (Ta), chromium (Cr) or tungsten (W). The drain electrode 125 may be insulated from the gate electrode 123. The drain electrode 125 may be disposed on a layer different from the gate electrode 123. For example, the drain electrode 125 may be disposed on the interlayer insulating layer 114. The drain electrode 125 may be disposed on the same layer as the source electrode 124. The drain electrode 125 may include the same material as the source electrode 124. For example, the drain electrode 125 may be formed simultaneously with the source electrode 124. The drain electrode 125 may include a material different from the gate electrode 123.

The drain electrode 125 may be electrically connected to the drain region of the semiconductor pattern 121. For example, the interlayer insulating layer 114 may include a drain contact hole partially exposing the drain region of the semiconductor pattern 121. The drain electrode 125 may be in direct contact with the drain region of the semiconductor pattern 121 through the drain contact hole.

The switching thin film transistor T1 may have the same structure as the driving thin film transistor T2. For example, the switching thin film transistor T1 may include a gate electrode being electrically connected to the scan line SL, a source electrode being electrically connected to the data line DL, and a drain electrode being electrically connected to the gate electrode 123 of the driving thin film transistor T2. The source electrode 124 of the driving thin film transistor T2 may be connected to a first power voltage supply line VDD which supplies a positive power voltage. The storage capacitor Cst may maintain a voltage applied to the gate electrode 123 of the driving thin film transistor T2 during one frame. For example, the storage capacitor Cst may be connected between the gate electrode 123 and the drain electrode 125 of the driving thin film transistor T2.

The light-emitting device 130 may emit light corresponding to the driving current supplied from the pixel driving circuit. For example, the light-emitting device 130 may include a first emission electrode 131, a light-emitting stack 132, and a second emission electrode 133, which are sequentially stacked on the device substrate 110.

The first emission electrode 131 may be electrically connected to the drain electrode 125 of the driving thin film transistor T2. For example, the driving current generated by the pixel driving circuit may be supplied to the first emission electrode 131 of the light-emitting device 130. The first emission electrode 131 may include a conductive material. The first emission electrode 131 may include a material having high reflectance. For example, the first emission electrode 131 may include a metal, such as aluminum (Al), titanium (Ti), copper (Cu), molybdenum (Mo), tantalum (Ta), chromium (Cr) or tungsten (W). The first emission electrode 131 may have a multi-layer structure. For example, the first emission electrode 131 may include a structure in which a reflective electrode formed of a metal is disposed between transparent electrodes formed of a transparent conductive material, such as ITO and IZO.

The light-emitting stack 132 may generate the light having a luminance corresponding to a voltage difference between the first emission electrode 131 and the second emission electrode 133. For example, the light-emitting stack 132 may include an emission material layer (EML) having an emission material. The emission material may include an organic material, an inorganic material or a hybrid material. For example, the touch display apparatus according to the embodiment of the present disclosure may be an organic light-emitting display apparatus including an organic emission material.

The light-emitting stack 132 may have a multi-layer structure. For example, the light-emitting stack 132 may include at least one of a hole injection layer (HIL), a hole transport layer (HTL), an electron transport layer (ETL) and an electron injection layer (EIL). The light-emitting stack 132 may include a plurality of the emission material layer. For example, the light-emitting stack 132 may include a charge generation layer (CGL) between a first emission material layer and a second emission material layer. The second emission material layer may include the same material as the first emission material layer. Thus, in the touch display apparatus according to the embodiment of the present disclosure, the luminous efficiency and the sharpness of color may be improved.

The second emission electrode 133 may include a conductive material. The second emission electrode 133 may have a transmittance higher than the first emission electrode 131. For example, the second emission electrode 133 may be a transparent electrode formed of a transparent conductive material. The second emission electrode 133 may include a transparent conductive oxide, such as ITO, IZO and AZO. Thus, in the touch display apparatus according to the embodiment of the present disclosure, the light generated by the light-emitting stack 132 of each pixel area PA may emit to the outside through the second emission electrode 133 of the corresponding pixel area PA.

A device buffer layer 112 may be disposed between the device substrate 110 and the pixel driving circuit of each pixel area PA. The device buffer layer 112 may prevent or at least reduce pollution to the device substrate 110 in a process of forming the pixel driving circuits. The device buffer layer 112 may extend onto the non-display area NA of the device substrate 110. For example, an upper surface of the device substrate 110 toward the pixel driving circuit of each pixel area PA may be completely covered by the device buffer layer 112. The device buffer layer 112 may include an insulating material. For example, the device buffer layer 112 may include an inorganic insulating material, such as silicon oxide (SiO) and silicon nitride (SiN). The device buffer layer 112 may have a multi-layer structure. For example, the device buffer layer 112 may have a structure in which an inorganic insulating layer formed of silicon oxide (SiO) and an inorganic insulating layer formed of silicon nitride (SiN) are stacked.

A planarization layer 116 may be disposed between the pixel driving circuit and the light-emitting device 130 of each pixel area PA. The planarization layer 116 may remove a thickness difference due to the pixel driving circuit of each pixel area PA. For example, an upper surface of the planarization layer 116 opposite to the device substrate 110 may be a flat surface. The switching thin film transistor T1, the driving thin film transistor T2 and the storage capacitor Cst in each pixel area PA may be covered by the planarization layer 116. The planarization layer 116 may include an insulating material. The planarization layer 116 may include a material different from the interlayer insulating layer 114. For example, the planarization layer 116 may include an organic insulating material.

The first emission electrode 131 of each pixel area PA may be electrically connected to the pixel driving circuit of the corresponding pixel area PA by penetrating the planarization layer 116. For example, the planarization layer 116 may include pixel contact holes partially exposing the drain electrode 125 of the driving thin film transistor T2 in each pixel area PA. The first emission electrode 131 of each pixel area PA may be in direct contact with the drain electrode 125 of the driving thin film transistor T2 in the corresponding pixel area PA through one of the pixel contact holes.

The first emission electrode 131 of each pixel area PA may be insulated from the first emission electrode 131 of adjacent pixel area PA. The first emission electrode 131 of each pixel area PA may be spaced away from the first emission electrode 131 of adjacent pixel area PA. For example, a bank insulating layer 118 may be disposed between the first emission electrodes 131 of adjacent pixel areas PA. The bank insulating layer 118 may include an insulating material. For example, the bank insulating layer 118 may include an organic insulating material. The bank insulating layer 118 may cover an edge of the first emission electrode 131 in each pixel area PA. The light-emitting stack 132 and the second emission electrode 133 of each pixel area PA may be stacked on a portion of the corresponding first emission electrode 131 exposed by the bank insulating layer 118. For example, the bank insulating layer 118 may define an emission area EA in each pixel area PA.

Each of the pixel area PA may realize red, green, blue or white. Each of the pixel area PA may realize a color different from adjacent pixel area PA. For example, the light-emitting stack 132 of each pixel area PA may be spaced away from the light-emitting stack 132 of adjacent pixel area PA. The light-emitting stack 132 of each pixel area PA may include an end, which is disposed on the bank insulating layer 118.

A voltage applied to the second emission electrode 133 of each pixel area PA may be the same as a voltage applied to the second emission electrode 133 of adjacent pixel area PA. For example, the second emission electrode 133 of each pixel area PA may be electrically connected to a second power voltage supply line VSS which supplies a negative power voltage. Thus, in the touch display apparatus according to the embodiment of the present disclosure, the luminance of the light emitted from the light-emitting device 130 of each pixel area PA may be adjusted by the data signal applying the corresponding pixel area Pa. The second emission electrode 133 of each pixel area PA may be electrically connected to the second emission electrode 133 of adjacent pixel area PA. For example, the second emission electrode 133 of each pixel area PA may be in direct contact with the second emission electrode 133 of adjacent pixel area PA. The second emission electrode 133 of each pixel area PA may be formed simultaneously with the second emission electrode 133 of adjacent pixel area PA. Therefore, in the touch display apparatus according to the embodiment of the present disclosure, a process of forming the second emission electrode 133 on each pixel area PA may be simplified.

An encapsulating unit 140 may be disposed on the light-emitting device 130 of each pixel area PA. The encapsulating unit 140 may prevent or at least reduce the damage of the light-emitting devices 130 due to external moisture and/or oxygen. The light-emitting device 130 of each pixel area PA may be completely covered by the encapsulating unit 140. For example, the encapsulating unit 140 may extend onto the non-display area NA of the device substrate 110.

The encapsulating unit 140 may include at least one inorganic encapsulating layer 142 and 146 and at least one organic encapsulating layer 144. For example, the encapsulating unit 140 may have a structure in which at least one organic encapsulating layer 144 is disposed between inorganic encapsulating layers 142 and 146. The uppermost layer of the encapsulating unit 140 may be the inorganic encapsulating layer 142 and 146. For example, an upper surface and a side of the organic encapsulating layer 144 may be covered by the inorganic encapsulating layer 142 and 146. Thus, in the touch display apparatus according to the embodiment of the present disclosure, the penetration of the external moisture and oxygen may be effectively blocked or at least reduced.

The inorganic encapsulating layer 142 and 146 may include an inorganic insulating material. For example, the inorganic encapsulating layer 142 and 146 may include an inorganic insulating material capable of low-temperature deposition, such as silicon nitride (SiN), silicon oxide (SiO), silicon oxy-nitride (SiON) and aluminum oxide ($Al_2O_3$). Thus, in the touch display apparatus according to the embodiment of the present disclosure, the damage of the light-emitting stacks 132 due to a process of forming the inorganic encapsulating layer 142 and 146 may be prevented or at least reduced.

The organic encapsulating layer 144 may relieve stress due to the inorganic encapsulating layer 142 and 146. For example, the organic encapsulating layer 144 may include an organic insulating material, such as acryl resin, epoxy resin, poly-imide, poly-ethylene and silicon oxy-carbide (SiOC). A thickness difference due to the light-emitting devices 130 may be removed by the organic encapsulating layer 144. For example, an upper surface of the organic encapsulating layer 144 opposite to the device substrate 110 may be a flat surface.

The organic encapsulating layer 144 may be formed by an ink-jet method. For example, at least one dam 106 may be disposed on the non-display area NA of the device substrate 110. The dam 106 may block or at least reduce the flow of the organic encapsulating layer 144. The dam 106 may cross the display area AA and the display driving circuit 10. For example, the dam 106 may extend along an edge of the display area AA. Thus, in the touch display apparatus according to the embodiment of the present disclosure, a region in which the organic encapsulating layer 144 is formed may be defined by the dam 106. The dam 106 may be formed using a process of forming at least one of insulating layers, which are disposed between the device substrate 110 and the encapsulating unit 140. For example, the dam 106 may be formed simultaneously with the planarization layer 116. The dam 106 may include the same material as the planarization layer 116. For example, the dam 106 may include an organic insulating material. The interlayer insulating layer 114 may extend onto the non-display area NA of the device substrate 110. For example, the dam 106 may be disposed on the interlayer insulating layer 114. A thickness of the dam 106 may be the same as a thickness of the planarization layer 116.

A touch sensor Cm may be disposed on the encapsulating unit 140. The touch sensor Cm may sense the touch of the user and/or the tool. For example, the touch sensor Cm may detect the presence or the absence of the touch and the location of the touch through a change in mutual capacitance. The touch sensor Cm may include a touch driving line 152 and a touch sensing line 154.

A touch driving signal may be applied to the touch driving line 152. The touch driving line 152 may include first touch electrodes 152e and first bridges 152b. The first touch electrodes 152e may be disposed side by side on the encapsulating unit 140. The first bridges 152b may electrically connect between the first touch electrodes 152e. Each of the first bridges 152b may extend in a first direction. For example, each of the first touch electrodes 152e may be connected to adjacent first touch electrodes 152e in the first direction by one of the first bridges 152b.

The first touch electrodes 152e may include a conductive material. For example, the first touch electrodes 152e may be a transparent electrode formed of a transparent conductive material. The first touch electrodes 152e may include a transparent conductive oxide, such as ITO, IZO and AZO.

The first bridges 152b may include a conductive material. The first bridges 152b may include the same material as the first touch electrodes 152e. For example, the first bridges 152b may be a transparent electrode formed of a transparent conductive oxide, such as ITO, IZO and AZO. The first bridges 152b may be disposed on the same layer as the first touch electrodes 152e. For example, each of the first bridges 152b may be in direct contact with the corresponding first touch electrode 152e.

The touch sensing line 154 may include second touch electrodes 154e and second bridges 154b. The second touch electrodes 154e may be disposed side by side on the encapsulating unit 140. The second touch electrodes 154e may be disposed on the same layer as the first touch electrodes 152e. The second touch electrodes 154e may be insulated from the first touch electrodes 152e. For example, the second touch electrodes 154e may be disposed between the first touch electrodes 152e. The second touch electrodes 154e may have the same shape as the first touch electrodes 152e. For example, the first touch electrodes 152e and the second touch electrodes 154e may be disposed on the encapsulating unit 140, alternately. Thus, in the touch display apparatus according to the embodiment of the present disclosure, charges charged by the touch driving signal may be discharged through the touch sensing line 154. Therefore, the touch display apparatus according to the embodiment of the present disclosure may detect the touch of the user and/or the tool and the location of the touch using the touch sensor Cm.

The second touch electrodes 154e may include a conductive material. The second touch electrodes 154e may include the same material as the first touch electrodes 152e. For example, the second touch electrodes 154e may be a transparent electrode formed of a transparent conductive oxide, such as ITO, IZO and AZO. The second touch electrodes 154e may be insulated from the first bridges 152b. The second touch electrodes 154e may be spaced away from the first bridges 152b. For example, the first bridges 152b may cross between the second touch electrodes 154e.

The second bridges 154b may electrically connect between the second touch electrodes 154e. Each of the second bridges 154b may extend in a second direction. For example, each of the second touch electrodes 154e may be connected to adjacent second touch electrodes 154e in the second direction by one of the second bridges 154b. The second direction may be different from the first direction. For example, the second direction may be perpendicular to the first direction. The second bridges 154b may cross between the first touch electrodes 152e. For example, each of the second bridges 154b may cross one of the first bridges 152b. The second bridges 154b may be disposed on a layer different from the first bridges 152b. For example, the touch sensor Cm may include a touch insulating layer 156 disposed on the first touch electrodes 152e, the second touch electrodes 154e and the first bridges 152b, and the second bridges 154b may be disposed on the touch insulating layer 156. The touch insulating layer 156 may include an insulating material. For example, the touch insulating layer 156 may include an inorganic insulating material, such as silicon oxide (SiO) and silicon nitride (SiN). The touch insulating layer 156 may include touch contact holes 150 partially exposing each second touch electrode 154e. Each of the second bridges 154b may be in direct contact with two second touch electrodes 154e adjacent in the second direction through the touch contact holes 150.

The second bridges 154b may include a conductive material. The second bridges 154b may include a material different from the second touch electrodes 154e. The second bridges 154b may have a resistance that is less than the resistances of the first touch electrodes 152e, the second touch electrodes 154e and the first bridges 152b. For example, the second bridges 154b may include a metal, such as titanium (Ti), copper (Cu), molybdenum (Mo) and tantalum (Ta). Each of the second bridges 154b may have a multi-layer structure. For example, the second bridges 154b may have a three-layer structure, such as Ti/Al/Ti, MoTi/Cu/MoTi and Ti/Al/Mo.

The first touch electrodes 152e, the first bridges 152b, the second touch electrodes 154e and the second bridges 154b of the touch sensor Cm may be disposed in the display area AA of the device substrate 110. The emission area EA of each pixel area PA may be disposed among the first touch electrodes 152e, the first bridges 152b, the second touch electrode 154e and the second bridges 154b. For example, the first touch electrodes 152e, the first bridges 152b, the second touch electrode 154e and the second bridges 154b may overlap the bank insulating layer 118. Each of the first touch electrodes 152e and each of the second touch electrodes 154e may have a mesh shape including openings overlapping with the emission area EA of each pixel area PA. Thus, in the touch display apparatus according to the embodiment of the present disclosure, the accuracy of touch sensing using the touch sensor Cm may be improved, the decrease in light-extraction efficiency due to the first touch electrodes 152e, the first bridges 152b, the second touch electrodes 154e and the second bridges 154b of the touch sensor Cm may be reduced.

A touch buffer layer 148 may be disposed between the encapsulating unit 140 and the touch sensor Cm. The touch buffer layer 148 may reduce the parasitic capacitance generated between the second emission electrode 133 of each light-emitting device 130 and the touch sensor Cm. For example, the distance between the touch driving line 152 of the touch sensor Cm and the second emission electrode 133 of each light-emitting device 130 and a distance between the touch sensing line 154 of the touch sensor Cm and the second emission electrode 133 of each light-emitting device 130 may be increased by the touch buffer layer 148. Thus, in the touch display apparatus according to the embodiment of the present disclosure, the accuracy of the touch sensing due to the touch sensor Cm may be improved. The touch buffer layer 148 may include an insulating material. For example, the touch buffer layer 148 may include an inorganic insulating material, such as silicon oxide (SiO) and silicon nitride (SiN).

A touch passivation layer 158 may be disposed on the touch sensor Cm. The touch passivation layer 158 may prevent or at least reduce the damage of the touch sensor Cm due to external impact and moisture. For example, the first touch electrodes 152e, the second touch electrodes 154e, the first bridges 152b and the second bridges 154b may be completely covered by the touch passivation layer 158. The touch passivation layer 158 may include an insulating material. For example, the touch passivation layer 158 may include an inorganic insulating material, such as silicon oxide (SiO) and silicon nitride (SiN) or an organic insulating material. An end of the touch passivation layer 158 may be disposed on the encapsulating unit 140. For example, the touch passivation layer 158 may be formed on only the display area AA.

A photo-electric device 200 may be disposed between the encapsulating unit 140 and the touch sensor Cm. The photo-electric device 200 may generate an electrical energy using the incident light. For example, the photo-electric device 200 may include light-absorbing layer 220. The light-absorbing layer 220 may convert energy of the light incident through the touch sensor Cm into the electrical energy. For example, the light-absorbing layer 220 may include a semiconductor stack 222 having a stacked structure of an n-type semiconductor layer 222n, an i-type semiconductor layer 222i and a p-type semiconductor layer 222p.

If the light incident on the semiconductor stack 222 supplies the energy equal or greater to an optical band gap, photo-reactive carriers may be generated in the i-type semiconductor layer 222i. An electron of the photo-reactive carriers may move to the n-type semiconductor layer 222n, and a hole of the photo-reactive carriers may move to the p-type semiconductor layer 222p, so that photo-voltaic force may be generated inside of the semiconductor stack 222. That is, in the touch display apparatus according to the embodiment of the present disclosure, the energy of the light incident on the light-absorbing layer 220 may be converted into the electrical energy by the semiconductor stack 222.

The light-absorbing layer 220 may overlap the first touch electrodes 152e, the second touch electrodes 154e, the first bridges 152b and the second bridges 154b of the touch sensor Cm. For example, the light-absorbing layer 220 may include first light-absorbing patterns 2201 overlapping with the first touch electrodes 152e, second light-absorbing patterns 2202 overlapping with the second touch electrodes 154e and photo-electric bridges 2203 between the first light-absorbing patterns 2201 and the second light-absorbing patterns 2202, as shown in FIG. 5. The first light-absorbing patterns 2201 may have the same shape as the first touch electrodes 152e. The second light-absorbing patterns 2202 may have the same shape as the second touch electrodes 154e. For example, each of the first light-absorbing patterns 2201 and the second light-absorbing patterns 2202 may have a mesh shape including openings overlapping with the emission area EA of each pixel area PA. Each of the photo-electric bridges 2203 may overlap one of the first bridges 152b and one of the second bridges 154b. For example, each of the photo-electric bridges 2203 may have a shape of "+". Each of the photo-electric bridges 2203 may connect between the first light-absorbing patterns 2201 disposed adjacent to each other in the first direction, and between the second light-absorbing patterns 2202 disposed adjacent to each other in the second direction. The first light-absorbing patterns 2201, the second light-absorbing patterns 2202 and the photo-electric bridges 2203 may overlap the bank insulating layer 118. Thus, in the touch display apparatus according to the embodiment of the present disclosure, the decrease in the light extraction efficiency due to the light-absorbing layer 220 may be prevented or at least reduced.

The first light-absorbing patterns 2201, the second light-absorbing patterns 2202 and the photo-electric bridges 2203 may be disposed on the same layer. For example, the photo-electric bridges 2203 may be in direct contact with the first light-absorbing patterns 2201 and the second light-absorbing patterns 2202. The first light-absorbing patterns 2201, the second light-absorbing patterns 2202 and the photo-electric bridges 2203 may have the same structure. For example, the first light-absorbing patterns 2201, the second light-absorbing patterns 2202 and the photo-electric bridges 2203 may be simultaneously formed.

The photo-electric device 200 may include a lower electrode 210 between the encapsulating unit 140 and the light-absorbing layer 220. The lower electrode 210 may overlap the light-absorbing layer 220. For example, the lower electrode 210 may include first lower patterns 2101 overlapping with the first light-absorbing patterns 2201, second lower patterns 2102 overlapping with the second light-absorbing patterns 2202, and lower bridges 2103 overlapping with the photo-electric bridges 2203, as shown in FIG. 5. The first lower patterns 2101 may have the same shape as the first light-absorbing patterns 2201. The second lower patterns 2102 may have the same shape as the second light-absorbing patterns 2202. For example, each of the first lower patterns 2101 and the second lower patterns 2102 may have a mesh shape including openings overlapping with the emission area EA of each pixel area PA. The lower bridges 2103 may have the same shape as the photo-electric bridges 2203. For example, each of the lower bridges 2103 may have a shape of "+". Each of the lower bridges 2103 may connect between the first lower patterns 2101 disposed adjacent to each other in the first direction and between the second lower patterns 2102 disposed adjacent to each other in the second direction. The first lower patterns 2101, the second lower patterns 2102 and the lower bridges 2103 may overlap the bank insulating layer 118. Thus, in the touch display apparatus according to the embodiment of the present disclosure, the decrease in the light extraction efficiency due to the lower electrode 210 may be prevented or at least reduced.

The lower electrode 210 may include a conductive material. The lower electrode 210 may have a material having high reflectance. For example, the lower electrode 210 may include a metal, such as aluminum (Al), titanium (Ti), copper (Cu), molybdenum (Mo), tantalum (Ta), chromium (Cr) or tungsten (W). The lower electrode 210 may have a multi-layer structure. For example, the lower electrode 210 may have a three-layer structure, such as Ti/Al/Ti, MoTi/Cu/MoTi and Ti/Al/Mo. Thus, in the touch display apparatus according to the embodiment of the present disclosure, the light passing through the light-absorbing layer 220 may be reflected toward the light-absorbing layer 220 by the lower electrode 210. Therefore, in the touch display apparatus according to the embodiment of the present disclosure, the photo-electric conversion efficiency may be improved.

The first lower patterns 2101, the second lower patterns 2102 and the lower bridges 2103 may be disposed on the same layer. For example, the lower bridges 2103 may be in direct contact with the first lower patterns 2101 and the second lower patterns 2102. The first lower patterns 2101, the second lower patterns 2102 and the lower bridges 2103 may include the same material. The first lower patterns 2101, the second lower patterns 2102 and the lower bridges 2103 may have the same structure. For example, the first lower patterns 2101, the second lower patterns 2102 and the lower bridges 2103 may be simultaneously formed.

The light-absorbing layer 220 may be disposed between the lower electrode 210 and the first touch electrodes 152e, between the lower electrode 210 and the second touch electrodes 154e, and between the lower electrode 210 and the first bridges 152b. For example, a lower surface of the light-absorbing layer 220 toward the device substate 110 may be in contact with the lower electrode 210, and an upper surface of the light-absorbing layer 220 opposite to the device substrate 110 may be in contact with the first touch electrodes 152e, the second touch electrodes 154e and the first bridges 152b. That is, in the touch display apparatus according to the embodiment of the present disclosure, the first touch electrodes 152e, the second touch electrodes 154e and the first bridges 152b of the touch sensor Cm may function as an upper electrode of the photo-electric device 200. Thus, in the touch display apparatus according to the embodiment of the present disclosure, a process of forming the photo-electric device 200 and the touch sensor Cm may be simplified. Therefore, in the touch display apparatus according to the embodiment of the present disclosure, a process efficiency may be improved.

The n-type semiconductor layer 222n of the light-absorbing layer 220 may be in contact with the lower electrode 210. The p-type semiconductor layer 222p of the light-absorbing layer 220 may be disposed close to the touch sensor Cm. The photo-electric layer 220 may include a barrier layer 224 between the p-type semiconductor layer 222p of the semiconductor stack 222 and the touch sensor Cm. The barrier layer 224 may include an insulating material. For example, the barrier layer 224 may include an inorganic insulating material, such as silicon oxide (SiO) and silicon nitride (SiN). Thus, in the touch display apparatus according to the embodiment of the present disclosure, the movement of hole generated by the semiconductor stack 222 may be blocked or at least reduced by the barrier layer 224. That is, in the touch display apparatus according to the embodiment of the present disclosure, the recombination of the electron and the hole in the first touch electrodes 152e, the second touch electrodes 154e and the first bridges 152b of the touch sensor Cm, which function as the upper electrode of the photo-electric device 200 may be suppressed. Therefore, in the touch display apparatus according to the embodiment of the present disclosure, a density of dark current may be decreased.

The barrier layer 224 may extend onto a side of the semiconductor stack 222. For example, a side of the lower electrode 210 may be covered by the barrier layer 224. Thus, the touch display apparatus according to the embodiment of the present disclosure may prevent or at least reduce the electric connection between the first touch electrodes 152e, the second touch electrodes 154e and the bridges 152b of the touch sensor Cm and the lower electrode 210.

Routing lines RL1, RL2 and 160 being insulated from the display signal line DSL may be disposed on the non-display area NA of the device substrate 110. For example, the routing lines RL1, RL2 and 160 may include touch routing lines RL1 and RL2 electrically connected to the touch sensor Cm and photo-electric routing line 160 electrically connected to the photo-electric device 200.

The touch routing lines RL1 and RL2 may connect the touch sensor Cm to a touch controller 32 of touch driving circuit 20. For example, the touch routing lines RL1 and RL2 may include first touch routing lines RL1 connected to the first touch electrodes 152e of the touch driving line 152 and second touch routing lines RL2 connected to the second touch electrodes 154e of the touch sensing line 154. The touch driving signal may be applied through the first touch routing lines RL1, and the charge charged by the touch driving signal may be discharged through the second touch routing lines RL2.

The first touch electrodes 152e connected in the first direction by the first bridges 152b may be connected to one of the first touch routing lines RL1. For example, each of the first touch routing lines RL1 may be extend from one of the first touch electrodes 152e. The first touch routing lines RL1 may include a conductive material. The first touch routing lines RL1 may have a multi-layer structure. For example, each of the first touch routing lines RL1 may have a stacked structure of a first routing layer 162, a second routing layer 164 and a third routing layer 166.

The first touch routing lines RL1 may be formed using a process of forming the photo-electric device 200 and the touch sensor Cm. For example, the first routing layer 162 may be formed simultaneously with the lower electrode 210, the second routing layer 164 may be formed simultaneously with the first touch electrodes 152e, the second touch electrodes 154e and the first bridges 152b, and the third routing layer 166 may be formed simultaneously with the second bridges 154b. The first routing layer 162 may have the same structure as the lower electrode 210. For example, the first routing layer 162 may have a three-layer structure, such as Ti/Al/Ti, MoTi/Cu/MoTi and Ti/Al/Mo. The second routing layer 164 may include the same material as the first touch electrodes 152e, the second touch electrodes 154e and the first bridges 152b. For example, the second routing layer 164 may be a transparent electrode made of a transparent conductive oxide, such as ITO, IZO and AZO. The second routing layer 164 may be in direct contact with the first routing layer 162. The third routing layer 166 may have the same structure as the second bridges 154b. For example, the third routing layer 166 may have a three-layer structure, such as Ti/Al/Ti, MoTi/Cu/MoTi and Ti/Al/Mo.

The touch insulating layer 156 may extend beyond the encapsulating unit 140. For example, the touch insulating layer 156 may be disposed between the second routing layer 164 and the third routing layer 166. The third routing layer 166 may be electrically connected to the second routing layer 164. For example, the touch insulating layer 156 may include routing contact holes 182 exposing a portion of the second routing layer 164. The third routing layer 166 may be in direct contact with the portion of the second routing layer 164 through the routing contact holes 182. Thus, in the touch display apparatus according to the embodiment of the present disclosure, the disconnection of the first touch routing lines RL1 due to the external impact and the bending stress may be prevented or at least reduced. And, in the touch display apparatus according to the embodiment of the present disclosure, the resistance of each first touch routing line RL1 may be decreased. Therefore, in the touch display apparatus according to the embodiment of the present disclosure, signal delay may be reduced, and the touch sensitivity may be improved.

The second touch electrodes 154e connected in the second direction by the second bridges 154b may be connected to one of the second touch routing lines RL2. For example, each of the second touch routing lines RL2 may be extended from one of the second touch electrodes 154e. The second touch routing lines RL2 may include a conductive material. The second touch routing lines RL2 may have a multi-layer structure. The second touch routing lines RL2 may have the same structure as the first touch routing lines RL1. For example, each of the second touch routing lines RL2 may have a stacked structure of a first routing layer, a second routing layer and a third routing layer.

The second touch routing lines RL2 may be formed simultaneously with the first touch routing lines RL1. For example, the first routing layer of each second touch routing line RL2 may be formed simultaneously with the first routing layer 162 of each first touch routing line RL1, the second routing layer of each second touch routing line RL2 may be formed simultaneously with the second routing layer 164 of each second touch routing line RL1, and the third routing layer of each second touch routing line RL2 may be formed simultaneously with the third routing layer 166 of each first touch routing line RL1.

The touch insulating layer 156 may extend between the second routing layer and the third routing layer of each second touch routing line RL2. Some of the routing contact holes 182 of the touch insulating layer 156 may partially expose the second routing layer of each second touch routing line RL2. The third routing layer of each second touch routing line RL2 may be electrically connected to the second routing layer of the corresponding second touch routing line RL2 through the routing contact holes 182. Thus, in the touch display apparatus according to the embodiment of the present disclosure, the disconnection of the second touch routing lines RL2 due to the external impact and the bending stress may be prevented or at least reduced. And, in the touch display apparatus according to the embodiment of the present disclosure, the resistance of each second touch routing line RL2 may be reduced. Therefore, in the touch display apparatus according to the embodiment of the present disclosure, the signal delay may be reduced, and the touch sensitivity may be improved.

The photo-electric routing line 160 may electrically connect the photo-electric device 200 to a charging controller 46 of a photo-electric driver 40. For example, the photo-electric routing line 160 may be extended from the lower electrode 210. The photo-electric line 160 may be disposed on a region in which the first touch routing lines RL1 and the second touch routing lines RL2 are not disposed. For example, the first touch routing lines RL1 may be electrically connected to the first touch electrodes 152*e* at a first side of the display area AA toward the display driving circuit 10, the second touch routing lines RL2 may be electrically connected to the second touch electrodes 154*e* at a second side of the display area AA perpendicular to the first side of the display area AA, and the photo-routing line 160 may be electrically connected to the lower electrode 210 at a third side of the display area AA opposite to the second side of the display area AA, as shown in FIG. 2.

The photo-electric routing line 160 may have the same structure as the lower electrode 210. For example, the photo-electric routing line 160 may have a three-layer structure, such as Ti/Al/Ti, MoTi/Cu/MoTi and Ti/Al/Mo. The photo-electric routing line 160 may be formed simultaneously with the lower electrode 210. The photo-electric routing line 160 may be in direct contact with the lower electrode 210. Thus, in the touch display apparatus according to the embodiment of the present disclosure, the process efficiency may be improved. And, in the touch display apparatus according to the embodiment of the present disclosure, the loss of the electrical energy due to the photo-electric routing line 160 may be reduced.

The charging controller 46 may convert the electrical energy transmitted through the photo-electric routing line 160 into chargeable power by rectify, boost and step-down. For example, the charging controller 46 may be connected to a battery 44 by a power management unit 48, as shown in FIG. 6. The power management unit 48 may supply the electrical energy stored in the battery 44 to the display driving circuit 10 and the touch controller 32 by boost and step-down. The power management unit 48 may check the charge state and/or the discharge state of the battery 44, and control charging and discharging of the battery 44. For example, the power management unit 48 may charge the battery 44 using the electrical energy supplied from the charging controller 46. Thus, in the touch display apparatus according to the embodiment of the present disclosure, the using time without the external power connected may be increased by the photo-electric device 200. Furthermore, the touch display apparatus according to the embodiment of the present disclosure may prevent or at least reduce the battery 44 from being completely discharged. That is, in the touch display apparatus according to the embodiment of the present disclosure, the lifetime of the battery 44 may be improved.

The photo-electric driver 40 may include an illuminance sensor 42 electrically connected to the power management unit 48. The illuminance sensor 42 may detect external brightness. For example, the charging controller 46 may determine whether the battery 44 can be charged using the photo-electric device 200 by signal of the illuminance sensor 42. The power management unit 48 may request the connection of the external power source, when the electrical energy stored in the battery 44 is insufficient and the battery 44 cannot be charged by the photo-electric device 200. Thus, in the touch display apparatus according to the embodiment of the present disclosure, the charge state of the battery 44 may be efficiently adjusted.

The photo-electric driver 40 may be disposed in the touch driving circuit 20. The touch driving circuit 20 may be disposed outside the device substrate 110. For example, the touch driving circuit 20 may be mounted on a signal transmission film 30 electrically connected to the device substrate 110, as shown in FIG. 2. The first touch routing lines RL1, the second touch routing lines RL2 and the photo-electric routing line 160 may extend outwardly of the dam 106 along a surface of the inorganic encapsulating layer 142 and 146 covering an upper surface and a side of the organic encapsulating layer 144.

The non-display area NA of the device substrate 110 may include a pad area PD electrically connected to the signal transmission film 30. For example, display pads electrically connected to the display driving circuit 10, touch pads 170 electrically connected to the touch routing lines RL1 and RL2, and a photo-electric pad electrically connected to the photo-electric routing line 160 may be disposed in the pad area PD. The display signal lines DSL may be electrically connected to the display driving circuit 10 through the display pads. For example, the display driving circuit 10 may apply the scan signal and the data signal to each pixel area PA through the display pads and the display signal lines DSL. The touch driving line 152 and the touch sensing line 154 of the touch sensor Cm may be electrically connected to the touch driving circuit 20 by one of the touch pads 170, respectively. The photo-electric device 200 may be electrically connected to the photo-electric driver 40 through the photo-electric pad.

The display pads, the touch pads 170 and the photo-electric pad may be formed using a process of forming the pixel driving circuits, the light-emitting devices 130, the photo-electric device 200 and the touch sensor Cm. For example, each of the touch pads 170 may have a stacked structure of a first pad electrode 172 formed simultaneously with the source electrode 124 and the drain electrode 125 of each pixel area PA and a second pad electrode 174 formed simultaneously with the second bridges 154*b*. The third routing layer 166 of each touch routing line RL1 and RL2 may be in direct contact with the second pad electrode 174. Each of the display pads and the photo-electric pad may have the same structure as the touch pads 170.

An edge of the first pad electrode 172 may be covered by a pad passivation layer 178. The pad passivation layer 178 may include an insulating material. For example, the pad passivation layer 178 may include an organic insulating material. The first pad electrode 172 may be disposed on the interlayer insulating layer 114. For example, the pad passivation layer 178 may be formed simultaneously with the planarization layer 116. The pad passivation layer 178 may include the same material as the planarization layer 118. The second pad electrode 174 may be electrically connected to the first pad electrode 172. For example, the touch insulating layer 156 may include pad contact hole 176 exposing a portion of the first pad electrode 172. The second pad electrode 174 may be in direct contact with the first pad electrode 172 through the pad contact hole 176.

A bending area BA may be disposed between the display area AA and the pad area PD. The bending area BA may be a region in which the device substrate 110 is bent. For example, in the touch display apparatus according to the embodiment of the present disclosure, the display driving circuit 10 and the touch driving circuit 20 may be disposed on a lower surface of the device substrate 110 which is opposite to the touch sensor Cm. The planarization layer 116, the bank insulating layer 118, the dam 106, the encapsulating unit 140, the touch buffer layer 148 and the touch passivation layer 158 may be disposed outside the bending area BA. The touch insulating layer 156 may include an aperture overlapping with the bending area BA. Thus, in the touch display apparatus according to the embodiment of the present disclosure, the formation and propagation of cracks due to the bending stress may be blocked.

Jumping electrodes 108 may be disposed on the bending area BA of the device substrate 110. The jumping electrodes 108 may cross the bending area BA of the device substrate 110. For example, both end of each jumping electrode 108 may be disposed outside the bending area BA. An end of each jumping electrode 108 may be covered by the touch buffer layer 148, and another end of each jumping electrode 108 may be covered by the pad insulating layer 178.

The jumping electrodes 108 may include a conductive material. The jumping electrodes 108 may be formed using a process of forming a conductive layer disposed between the device substrate 110 and the planarization layer 116. For example, the jumping electrodes 108 may be formed simultaneously with the source electrode 124 and the drain electrode 125 of each pixel area PA. The jumping electrodes 108 may be disposed on the interlayer insulating layer 114. The jumping electrodes 108 may include the same material as the source electrode 124 and the drain electrode 125 of each pixel area PA.

A crack preventing layer 196 may be disposed on a portion of each jumping electrode 108 overlapping with the bending area BA of the device substrate 110. The crack preventing layer 196 may relieve the bending stress applied to the jumping electrodes 108. For example, the crack preventing layer 196 may include a material having high strain rate and high impact resistance. The crack preventing layer 196 may include an insulating material. For example, the crack preventing layer 196 may include an organic insulating material, such as epoxy resin and acryl resin. The crack preventing layer 196 may be formed using a process of forming one of insulating layers between the device substrate 110 and the touch passivation layer 158. For example, the crack preventing layer 196 may be formed simultaneously with the planarization layer 116. The crack preventing layer 196 may include the same material as the planarization layer 116.

The display signal lines DSL, the first touch routing lines RL1, the second touch routing lines RL2 and the photo-electric routing line 160 may partially divided in the bending area BA. For example, each of the display signal lines DSL, the first touch routing lines RL1, the second touch routing lines RL2 and the photo-electric routing line 160 may transmit a signal using one of the jumping electrodes 108. For example, a first jumping area JA1 may be disposed between the display area AA and the bending area BA, and a second jumping area JA2 may be disposed between the bending area BA and the pad area PD. Each of the display signal lines DSL, the first touch routing lines RL1, the second touch routing lines RL2 and the photo-electric routing line 160 may be connected to an end of one of the jumping electrodes 108 in the first jumping area JA1. Another end of each jumping electrode 108 may be connected to one of the display signal lines DSL, the first touch routing lines RL1, the second touch routing lines RL2 and the photo-electric routing line 160 in the second jumping area JA2. For example, the touch insulating layer 156 may include first jumping contact holes 168 exposing an end of each jumping electrode 108 in the first jumping area JA1 and second jumping contact holes 169 exposing another end of each jumping electrode 108 in the second jumping area JA2. Thus, in the touch display apparatus according to the embodiment of the present disclosure, the signal delay and the signal distortion due to the bending stress may be prevented or at least reduced.

A connecting area CA may be disposed between the second jumping area JA2 and the pad area PD. The second routing layer 162 of each touch routing line RL1 and RL2 on the connecting area CA may be in direct contact with the first routing layer 162 and the third routing layer 166 of the corresponding touch routing line RL1 and RL2. For example, the touch insulating layer 156 may include third jumping contact holes 188 partially exposing the second routing layer 164 of each touch routing line RL1 and RL2 on the connecting area CA. Thus, in the touch display apparatus according to the embodiment of the present disclosure, the resistance of each touch routing line RL1 and RL2 may be reduced.

FIGS. 7A to 12A, 7B to 12B and 7C to 12C are views sequentially showing a method of forming the touch display apparatus according to the embodiment of the present disclosure.

Figure 7A:
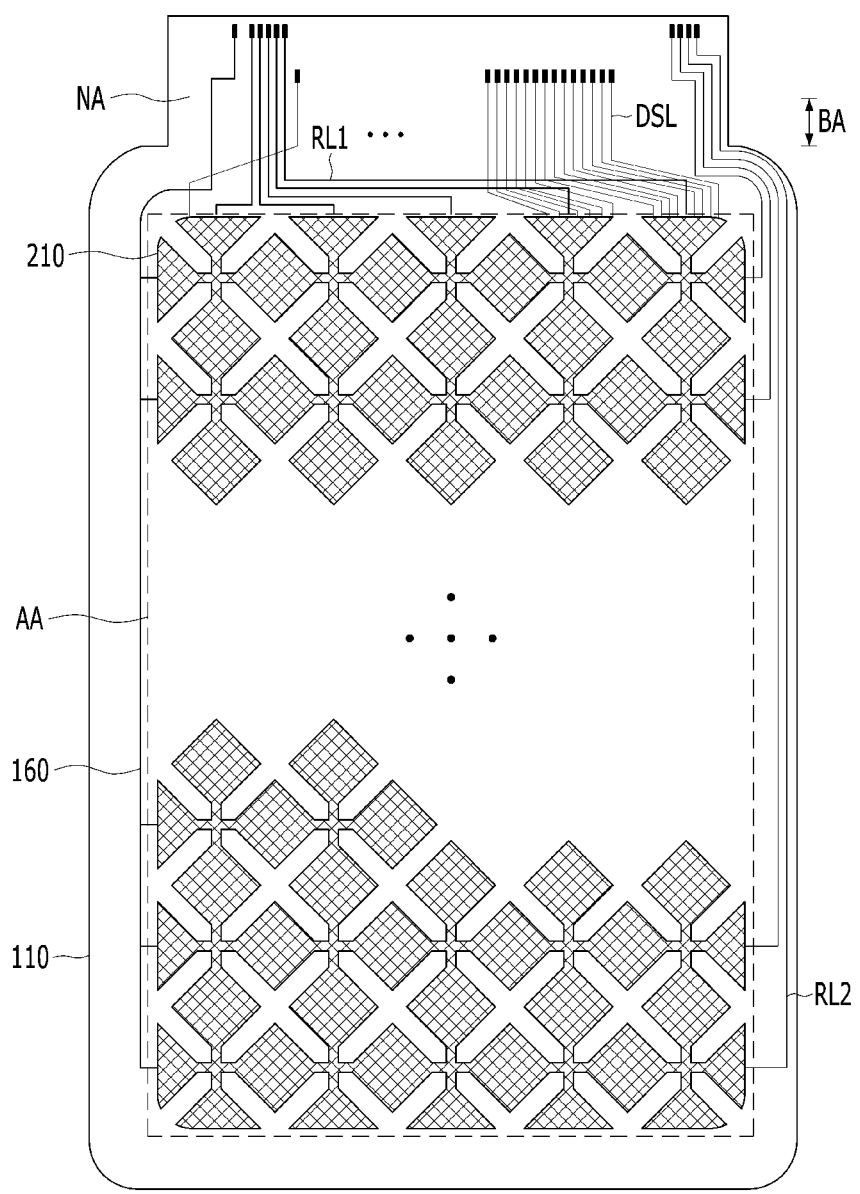
Figure 7B:
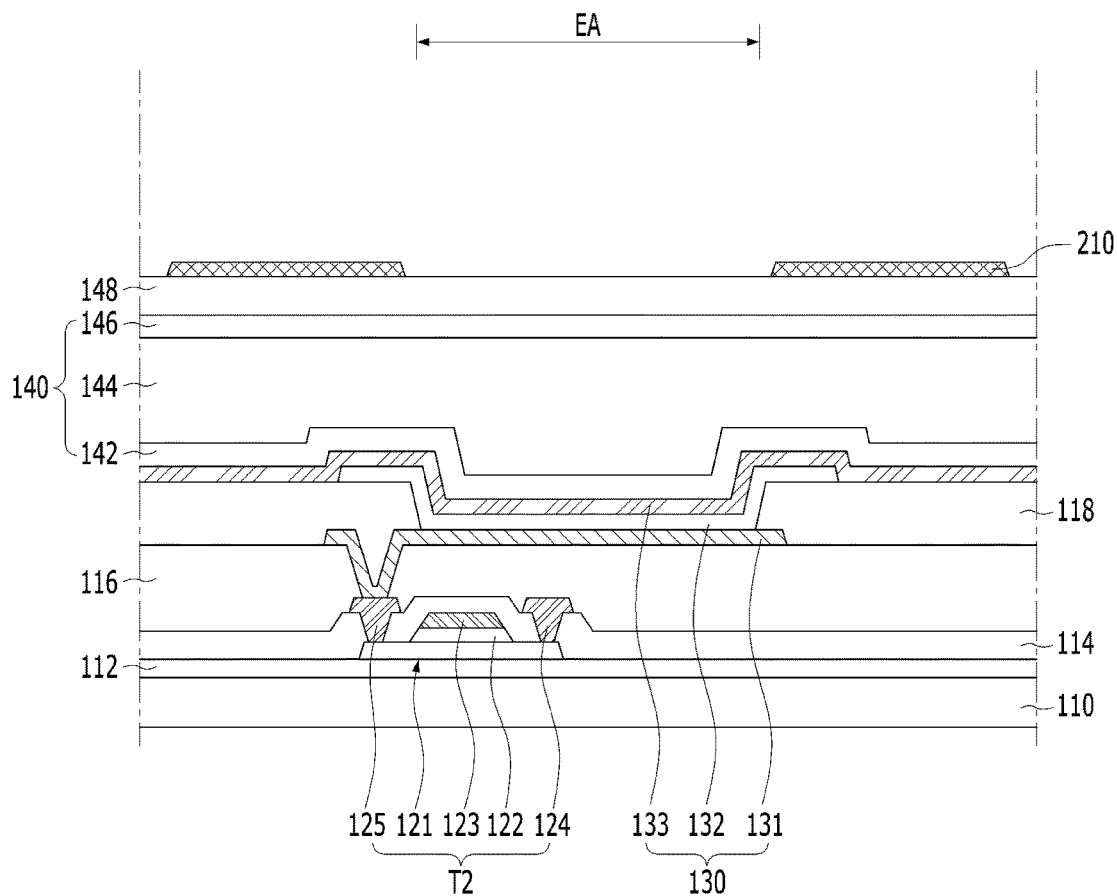
Figure 7C:
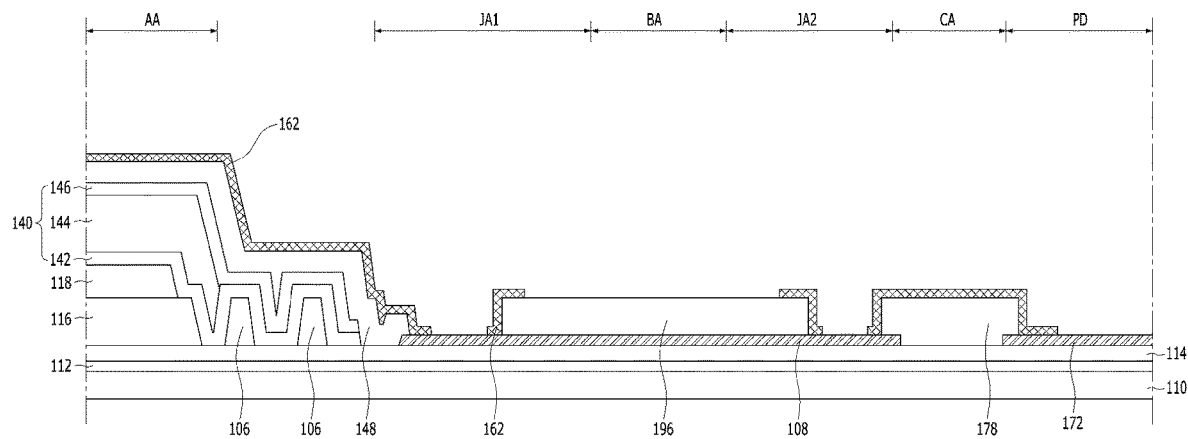

A method of forming the touch display apparatus according to the embodiment of the present disclosure will be described with reference to FIGS. 2 to 4, 7A to 12A, 7B to 12B and 7C to 12C. First, the method of forming the touch display apparatus according to the embodiment of the present disclosure may include a step of forming a lower electrode 210, first routing layers 162 and a photo-electric routing line 160 on a device substrate 110 in which pixel driving circuits including a driving thin film transistor T2, at least one dam 106, jumping electrodes 108, a device buffer layer 112, an interlayer insulating layer 114, a planarization layer 116, a bank insulating layer 118, light-emitting devices 130, an encapsulating unit 140, a touch buffer layer 148, a first pad electrode 172, a pad passivation layer 178 and a crack preventing layer 196 are formed, as shown in FIGS. 7A to 7C.

The device substrate 110 may include a display area AA in which emission areas EA are defined, and a non-display area NA disposed outside the display area AA. The non-display area NA may include a first jumping area JA1, a bending area BA, a second jumping area JA2, a connecting area CA and a pad area PA.

The pixel driving circuits, the light-emitting devices 130 and the encapsulating unit 140 may be formed on the display area AA. The dam 106 may be formed between the display area AA and the first jumping area JA1. The jumping electrodes 108 may cross the bending area BA. The crack preventing layer 196 may be formed on the bending area BA. The pad passivation layer 178 may be formed on the connecting area CA. The first pad electrode 172 may be formed on the pad area PD.

The lower electrode 210, the first routing layers 162 and the photo-electric routing layer 160 may be formed of a conductive material. For example, the lower electrode 210, the first routing layers 162 and the photo-electric routing line 160 may be formed of a metal, such as aluminum (Al), titanium (Ti), copper (Cu), molybdenum (Mo), tantalum (Ta), chromium (Cr) or tungsten (W). The lower electrode 210, the first routing layers 162 and the photo-electric routing line 160 may be formed in a multi-layer structure. For example, the lower electrode 210, the first routing layers 162 and the photo-electric routing line 160 may be formed in a three-layer structure, such as Ti/Al/Ti, MoTi/Cu/MoTi and Ti/Al/Mo.

The lower electrode 210, the first routing layers 162 and the photo-electric routing line 160 may be formed in the same structure. For example, a step of forming the lower electrode 210, the first routing layers 162 and the photo-electric routing line 160 may include a step of forming a conductive layer on the device substrate 110 by a deposition process using sputtering at normal temperature, and a step of pattering the conductive layer by a photo-lithography process and an etching process.

The lower electrode 210 may be formed in the display area AA. The lower electrode 210 may be spaced away from the emission area EA of each pixel area PA. For example, the lower electrode 210 may include lower patterns and lower bridges between the lower patterns. Each of the lower patterns may have a mesh shape including openings overlapping with the emission areas. The lower patterns and the lower bridges may overlap the bank insulating layer 118. Each of the lower bridges may connected the lower patterns in a first direction and a second direction. For example, each of the lower bridges may have a shape of "+". The lower bridges may be in direct contact with the lower patterns. Some of the lower patterns may be in direct contact with the photo-electric routing line 160. The first routing layers 162 may be spaced away from the lower electrode 210.

The first routing layers 162 and the photo-electric routing line 160 may be formed in a shape extending outside the dam 106 along a surface of the encapsulating unit 140. The first routing layers 162 and the photo-electric routing line 160 may be partially divided in the bending area BA. For example, each of the first routing layers 162 and the photo-electric routing line 160 may be connected to one of the jumping electrodes 108 in the first jumping area JA1 and the second jumping area JA2.

Figure 8A:
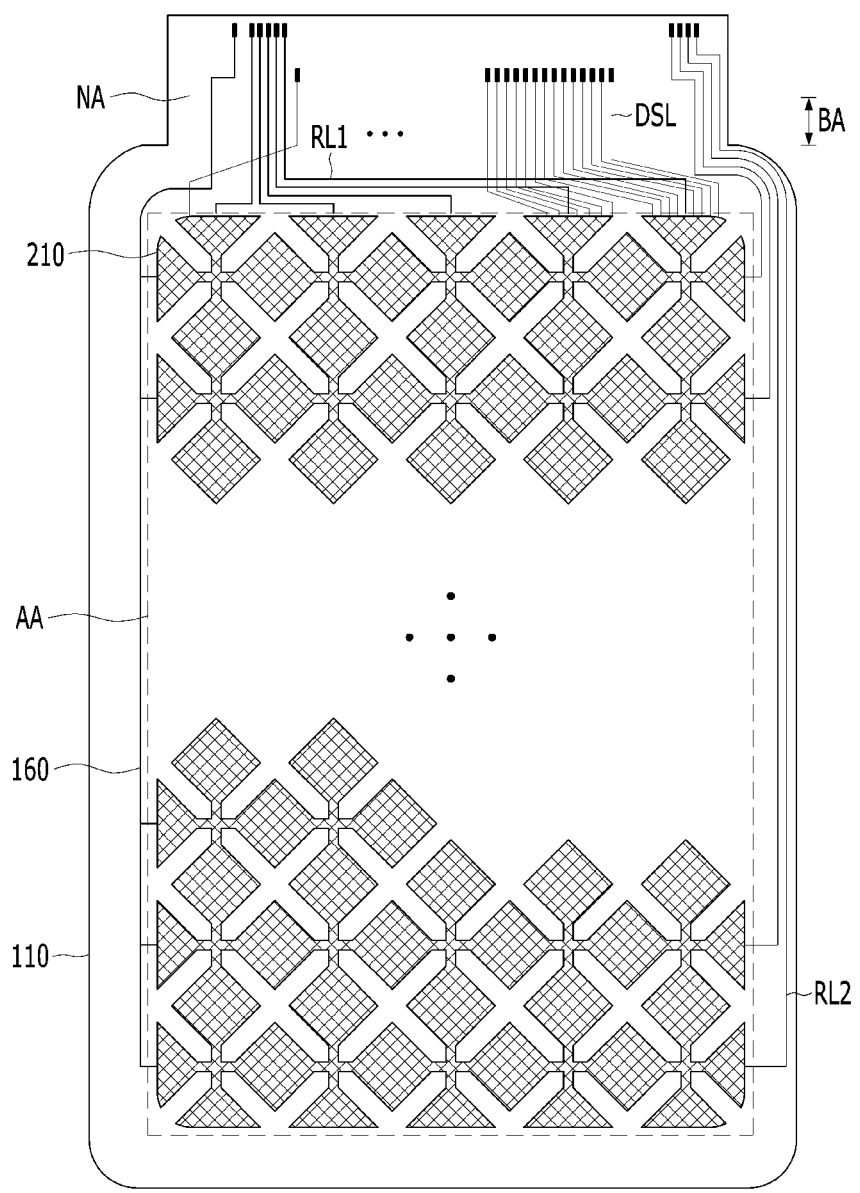
Figure 8B:
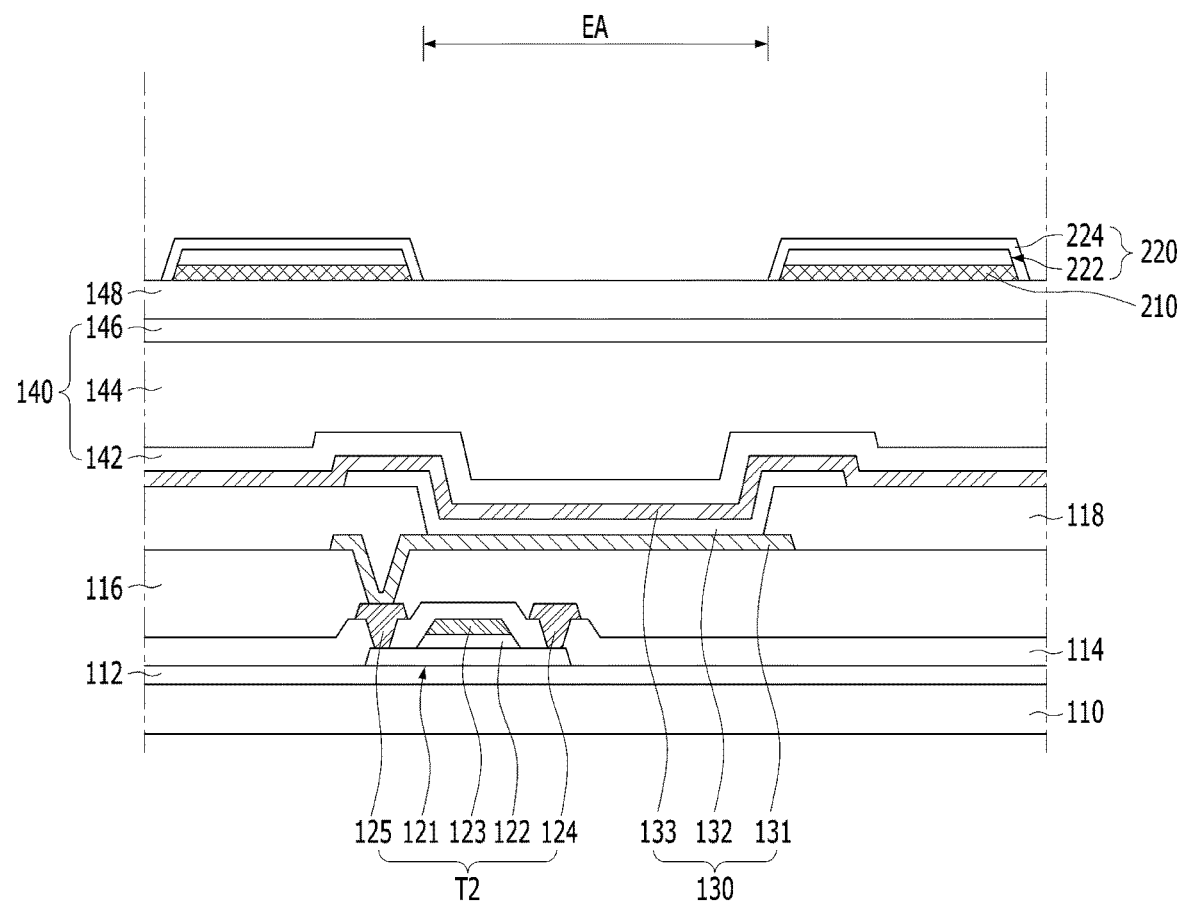
Figure 8C:
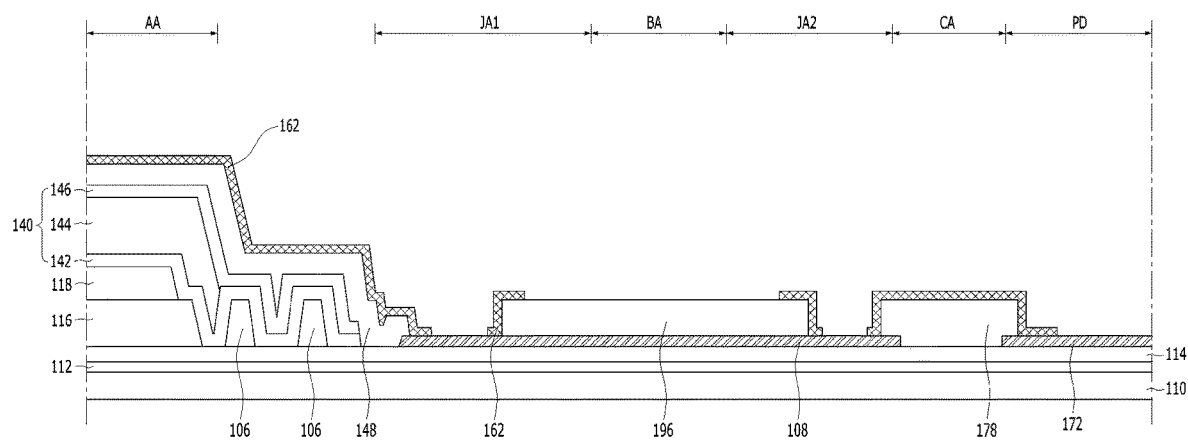

As shown in FIGS. 8A to 8C, the method of forming the touch display apparatus according to the embodiment of the present disclosure may include a step of the light-absorbing layer 220 on the lower electrode 210.

The light-absorbing layer 220 may be formed to overlap the lower electrode 210. For example, the light-absorbing layer 220 may include light-absorbing patterns having a mesh shape and a photo-electric bridges disposed between the light-absorbing patterns. Each of the light-absorbing patterns may overlap one of the lower patterns. Each of the photo-electric bridges may overlap one of the lower bridges. For example, each of the photo-electric bridges may have a shape of "+". The light-absorbing patterns and the photo-electric bridges may overlap the bank insulating layer 118.

The light-absorbing layer 220 may have a stack structure of a semiconductor stack 222 and a barrier layer 224. For example, each of the semiconductor stack 222 and the barrier layer 224 may include a region having a mesh shape. The barrier layer 224 may be formed to have a size different from the semiconductor stack 222. The barrier layer 224 may cover a side of the semiconductor stack 222 and a side of the lower electrode 210. For example, the step of forming light-absorbing layer 220 may include a step of forming the semiconductor stack 222 on the lower electrode 210 and a step of forming the barrier layer 224 on the semiconductor stack 222.

Figure 9A:
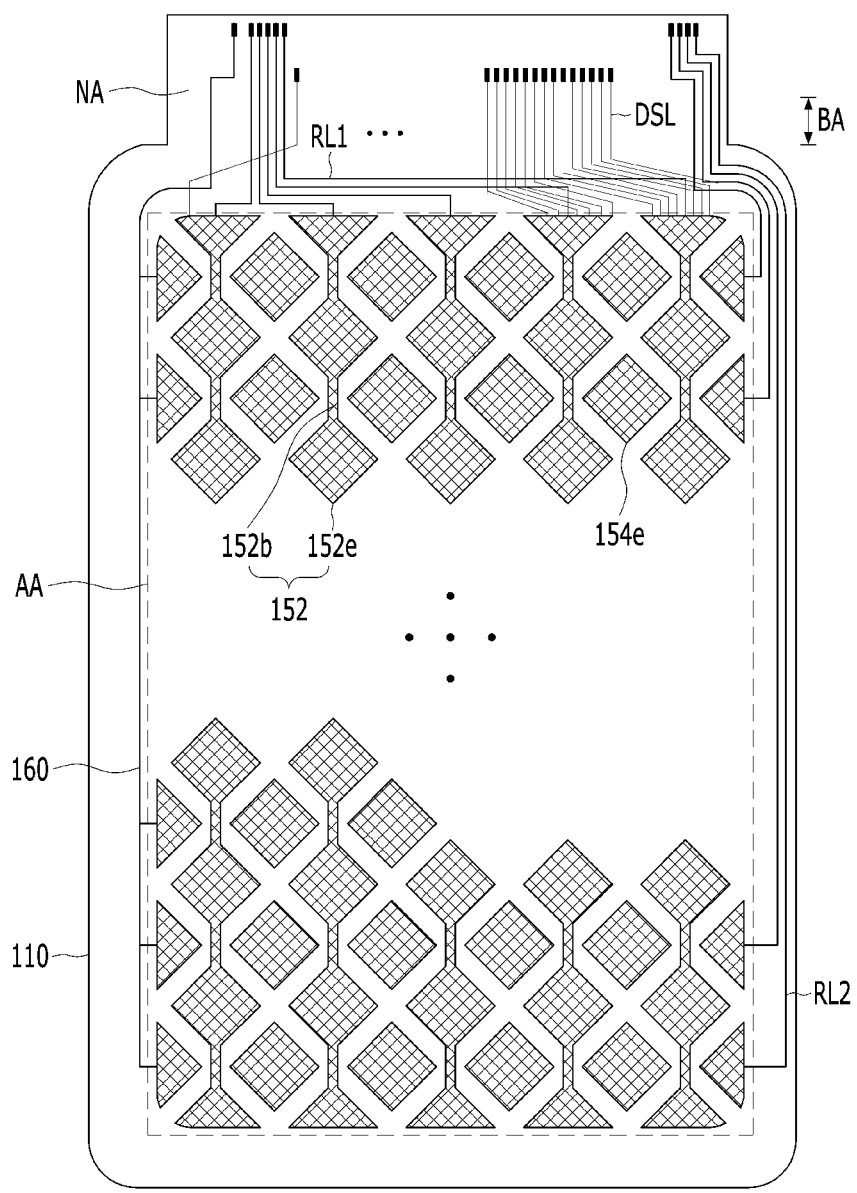
Figure 9B:
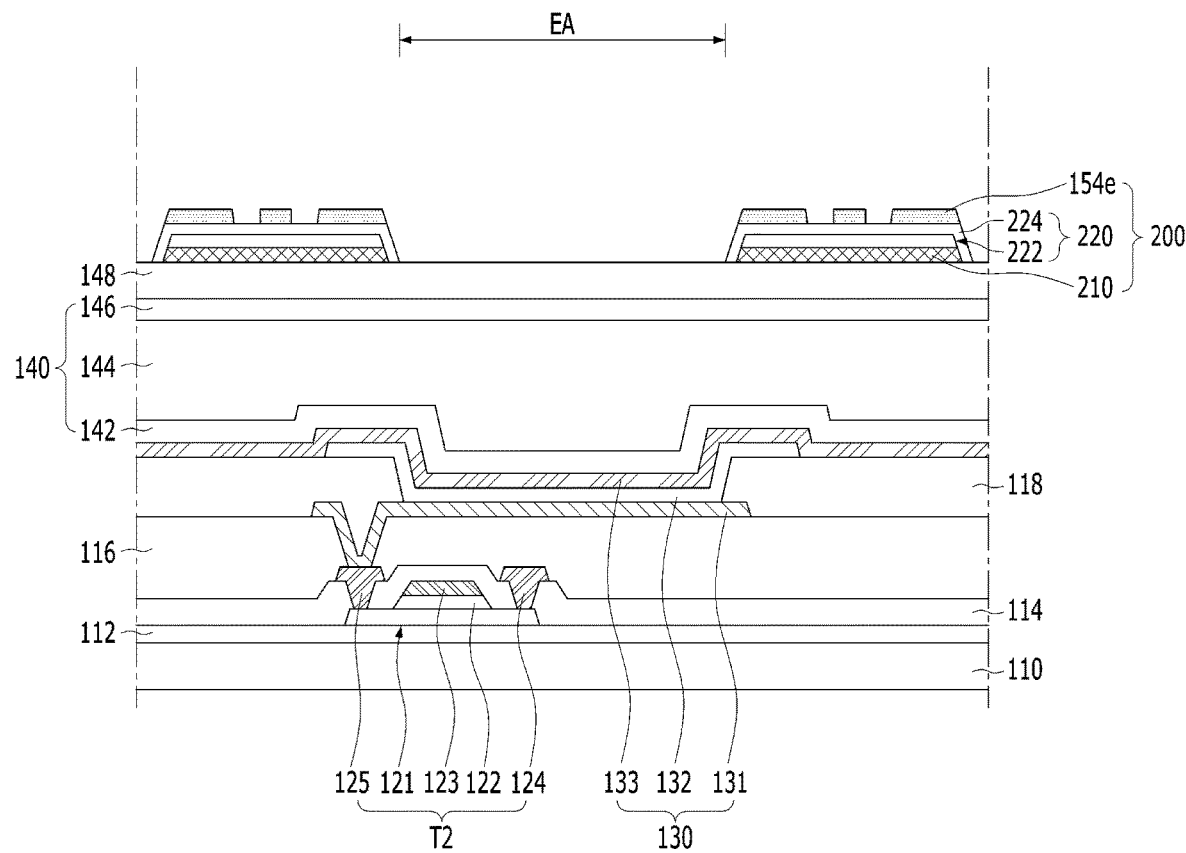
Figure 9C:
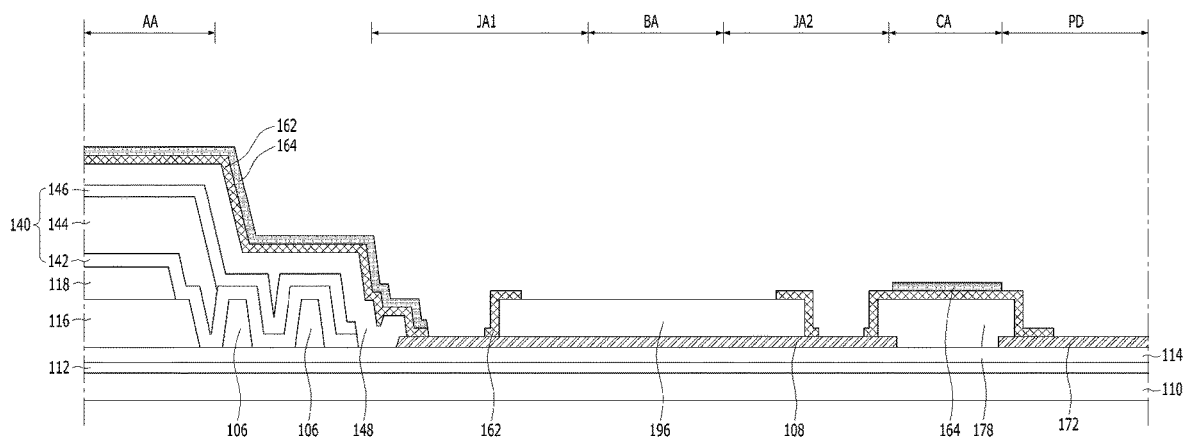

As shown in FIGS. 9A to 9C, the method of forming the touch display apparatus according to the embodiment of the present disclosure may include a step of forming first touch electrodes 152e, second touch electrodes 154e, first bridges 152b and second routing layers 164 on the device substrate 110 in which the light-absorbing layer 220 is formed.

The first touch electrodes 152e, the second touch electrodes 154e, the first bridges 152b and the second routing layers 164 may be formed of a transparent conductive material. For example, the first touch electrodes 152e, the second touch electrodes 154e, the first bridges 152b and the second routing layers 164 may be formed of a transparent conductive oxide, such as ITO, IZO and AZO.

The first touch electrodes 152e, the second touch electrodes 154e and the first bridges 152b may be formed on the light-absorbing layer 220. The first touch electrodes 152e, the second touch electrodes 154e and the first bridges 152b may overlap the light-absorbing layer 220. For example, the first touch electrodes 152e, the second touch electrodes 154e and the first bridges 152b may overlap the bank insulating layer 118. Each of the first touch electrodes 152e and the second touch electrodes 154e may overlap one of the light-absorbing patterns of the light-absorbing layer 220. For example, each of the first touch electrodes 152e and the second touch electrodes 154e may have a mesh shape including openings overlapping with the emission area EA of each pixel area.

The lower electrode 210, the light-absorbing layer 220, the first touch electrodes 152e, the second touch electrodes 154e and the first bridges 152b may constitute the photo-electric device 200. For example, an upper surface of the light-absorbing layer 220 opposite to the device substrate 110 may be in direct contact with the first touch electrodes 152e, the second touch electrodes 154e and the first bridges 152b. The first touch electrodes 152e, the second touch electrodes 154e and the first bridges 152b may function as an upper electrode of the photo-electric device 200.

Each of the second routing layers 164 may be formed on one of the first routing layers 162. For example, the second routing layers 164 may be partially divided on the bending area BA. Each of the second routing layers 164 may be in direct contact with the corresponding first routing layer 162.

The first touch electrodes 152e, the second touch electrodes 154e, the first bridges 152b and the second routing layers 164 may be formed simultaneously. For example, a step of forming the first touch electrodes 152e, the second touch electrodes 154e, the first bridges 152b and the second routing layers 164 may include a step of forming a transparent conductive layer on the device substrate 110 and a step of pattering the transparent conductive layer by the photo-lithograph process and the etching process.

Figure 10A:
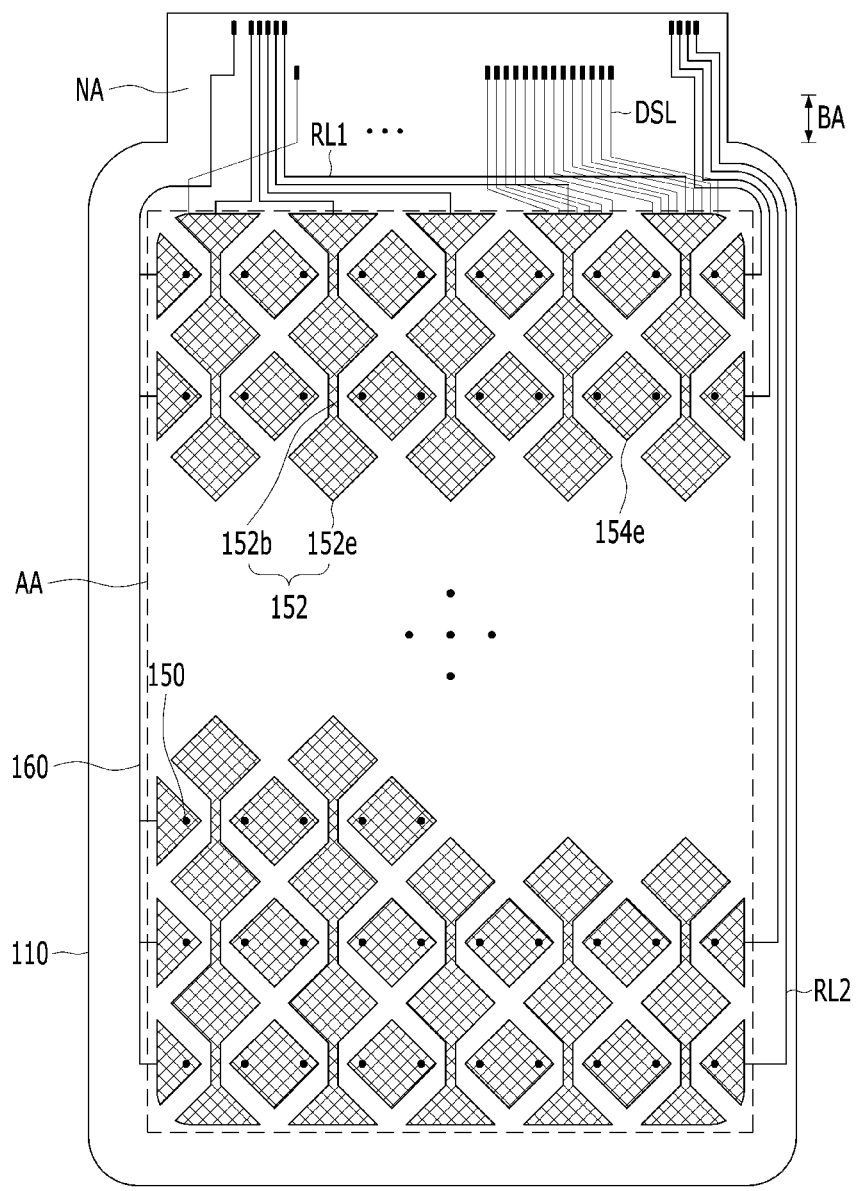
Figure 10B:
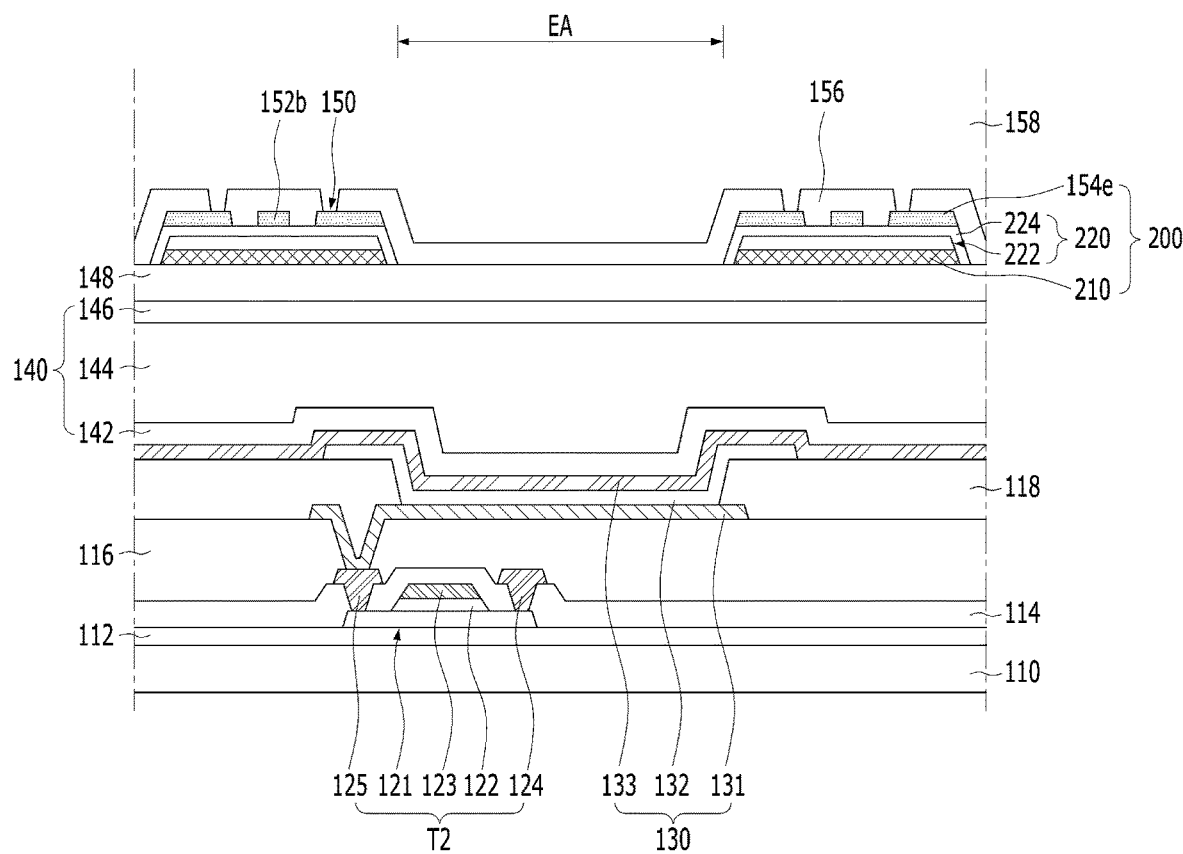
Figure 10C:
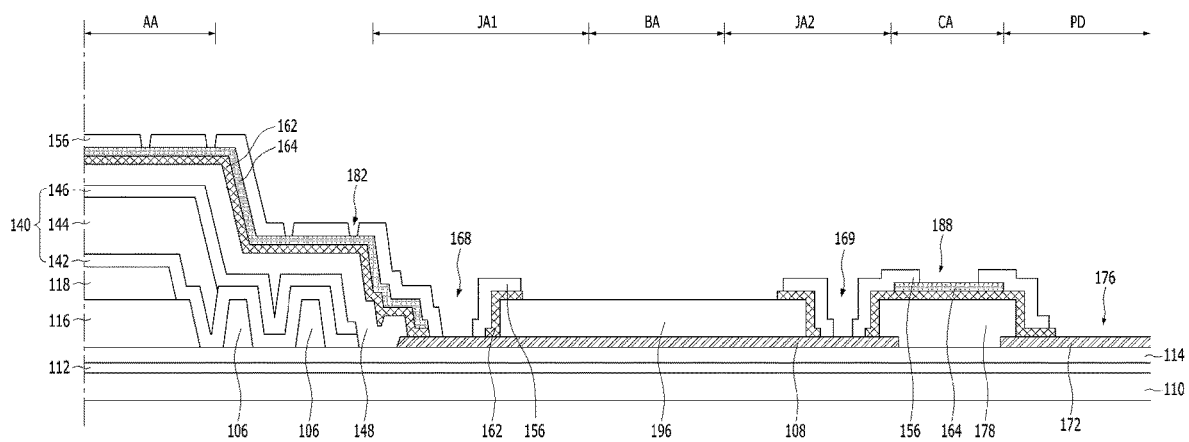

As shown in FIGS. 10A to 10C, the method of forming the touch display apparatus according to the embodiment of the present disclosure may include a step of forming a touch insulating layer 156 on the device substrate 110 in which the first touch electrodes 152e, the second touch electrodes 154e, the first bridges 152b and the second routing layers 164 are formed.

The touch insulating layer 156 may be formed of an insulating material. For example, the touch insulating layer 156 may be formed of an inorganic insulating material, such as silicon oxide (SiO) and silicon nitride (SiN). The touch insulating layer 156 may partially expose each second touch electrode 154e. For example, the touch insulating layer 156 may include touch contact holes 150 overlapping with a portion of each second touch electrode 154e. The touch insulating layer 156 may partially expose each second routing layer 164. For example, the touch insulating layer 156 may include routing contact holes 182 overlapping with a portion of each second routing layer 164. The touch insulating layer 156 may partially expose each jumping electrode 108 in the first jumping area JA1 and the second jumping area JA2. For example, the touch insulating layer 156 may include first jumping contact holes 168 overlapping with a portion of each jumping electrode 108 on the first jumping area JA1 and second jumping contact holes 169 overlapping with a portion of each jumping electrode 108 on the second jumping area JA2. The touch insulating layer 156 may partially expose each second routing layer 164 on the connecting area CA. For example, the touch insulating layer 156 may include third jumping contact holes 188 overlapping with a portion of each second routing layer 164 on the connecting area CA. The touch insulating layer 156 may partially expose each first pad electrode 172 on the pad area PD. For example, the touch insulating layer 156 may include pad contact holes 176 overlapping with a portion of each first pad electrode 172.

The touch contact holes 150, the routing contact holes 182, the first jumping contact holes 168, the second jumping contact holes 169, the third jumping contact holes 188 and the pad contact holes 176 may be formed simultaneously. For example, the step of forming the touch insulating layer 156 may include a step of forming an insulating layer on the device substrate 110 and a step of forming the touch contact holes 150, the routing contact holes 182, the first jumping contact holes 168, the second jumping contact holes 169, the third jumping contact holes 188 and the pad contact holes 176 in the insulating layer.

Figure 11A:
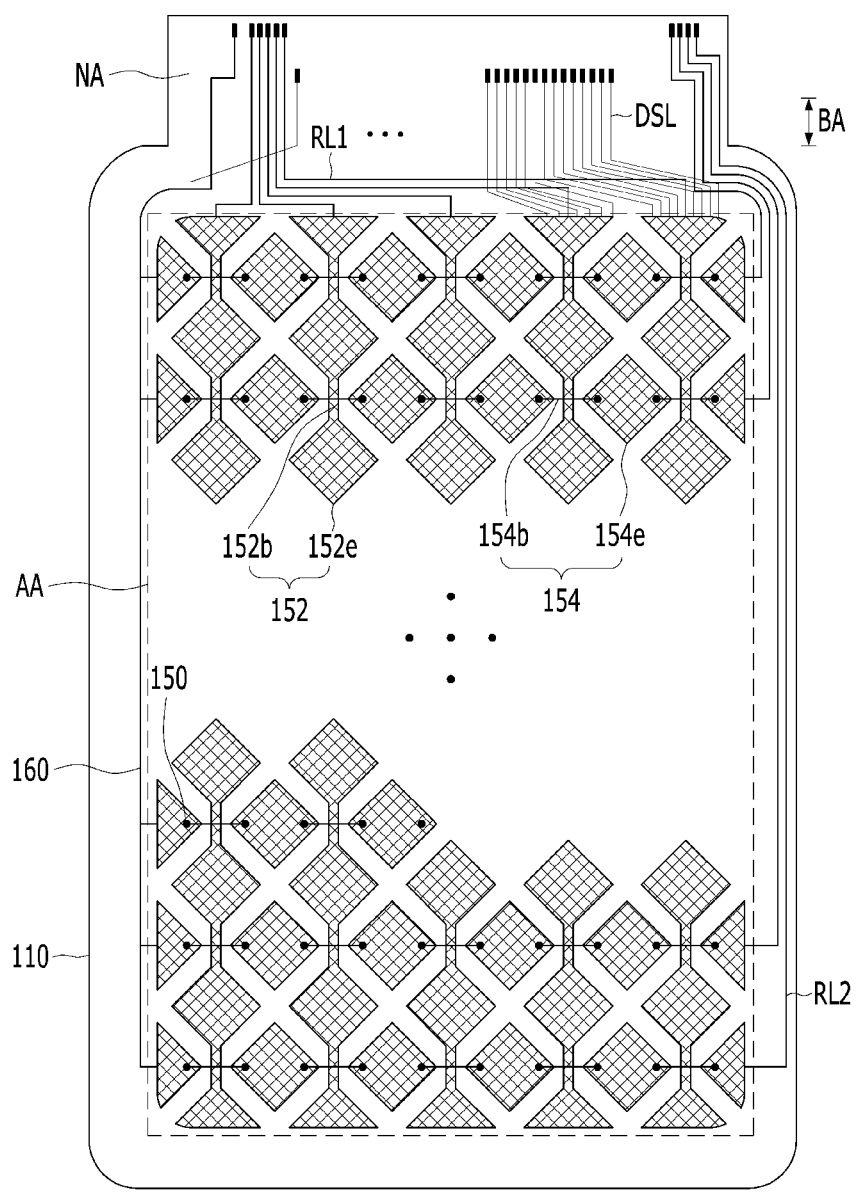
Figure 11B:
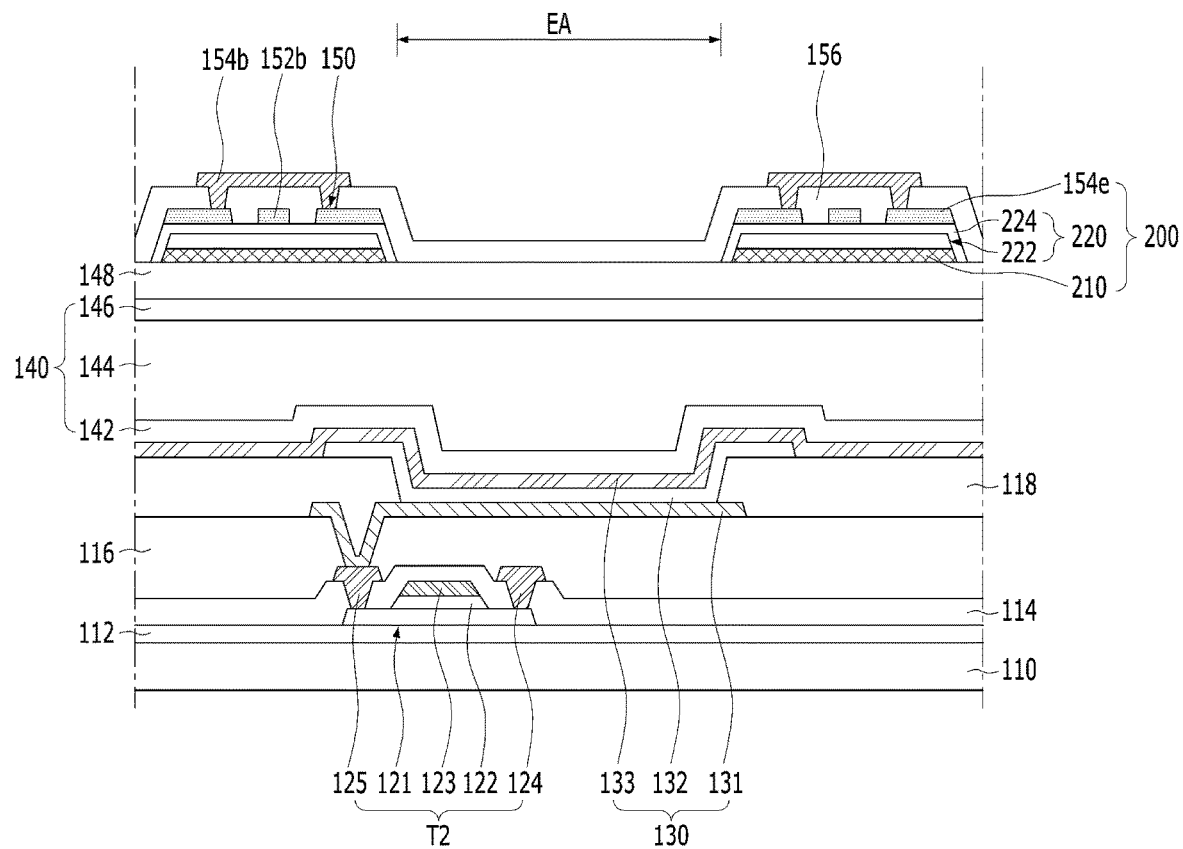
Figure 11C:
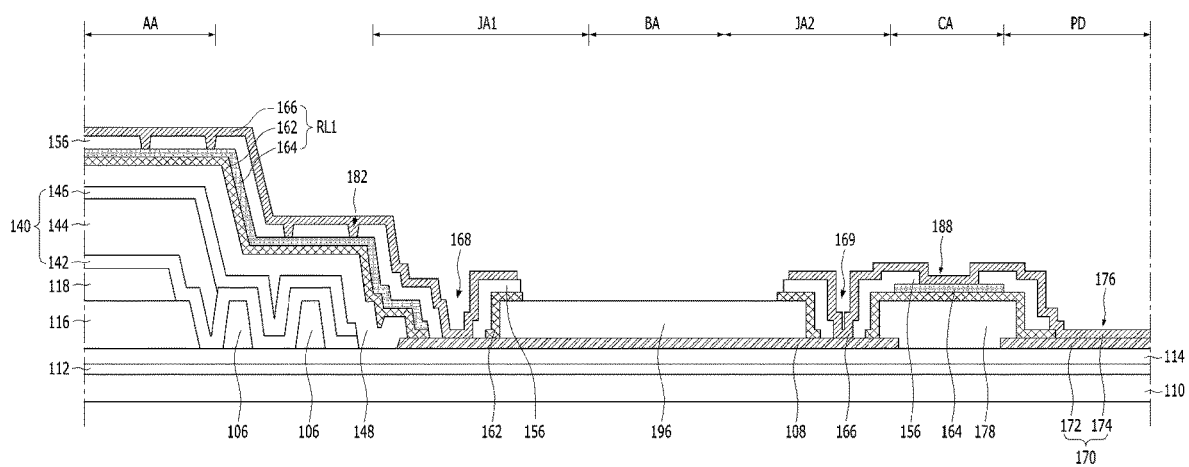

As shown in FIGS. 11A to 11C, the method of forming the touch display apparatus according to the embodiment of the present disclosure may include a step of forming second bridges 154b and third routing layers 166 on the touch insulating layer 156.

The second bridges 154b may connect each second touch electrode 154e to the second touch electrodes 154e adjacent in the second direction using the touch contact holes 150. The second bridges 154b may be formed of a conductive material. The second bridges 154b may be formed of a material different from the first touch electrodes 152e, the second touch electrodes 154e and the first bridges 152b. For example, the second bridges 154b may include a metal, such as titanium (Ti), copper (Cu), molybdenum (Mo) or tantalum (Ta). The second bridges 154b may have a resistance lower than the first touch electrodes 152e, the first bridges 152b and the second touch electrodes 154e. For example, each of the second bridges 154b may have a three-layer structure, such as Ti/Al/Ti, MoTi/Cu/MoTi and Ti/Al/Mo.

Each of the third routing layers 166 may be formed on one of the second routing layers 164. For example, each of the third routing layers 166 may be electrically connected to the corresponding second routing layer 164 through the routing contact holes 182. Each of the third routing layers 166 may be electrically connected to one of the jumping electrodes 108 through the first jumping contact holes 168. Each of the third routing layers 166 may be connect the corresponding jumping electrode 108 to one of the first pad electrodes 172 through the second jumping contact holes 169 and the pad contact holes 176. For example, touch pads 170 in which each of the first pad electrodes 172 and a portion of the corresponding third routing layer 166 are stacked may be formed on the pad area PD of the device substrate 110. Each of the third routing layers 166 may be electrically connected to the corresponding second routing layer 164 on the connecting area CA through the third jumping contact holes 188.

The third routing layers 166 may be formed simultaneously with the second bridges 154b. For example, the third routing layers 166 may include a metal, such as titanium (Ti), copper (Cu), molybdenum (Mo) or tantalum (Ta). Each of the third routing layers 166 may have a three-layer structure, such as Ti/Al/Ti, MoTi/Cu/MoTi and Ti/Al/Mo. For example, a step of forming the second bridges 154b and the third routing layers 166 may include a step of forming a conductive layer on entire surface of the device substrate 110 by a deposition process using sputtering at normal temperature, and a step of patterning the conductive layer by the photo-lithography process and the etching process.

Figure 12A:
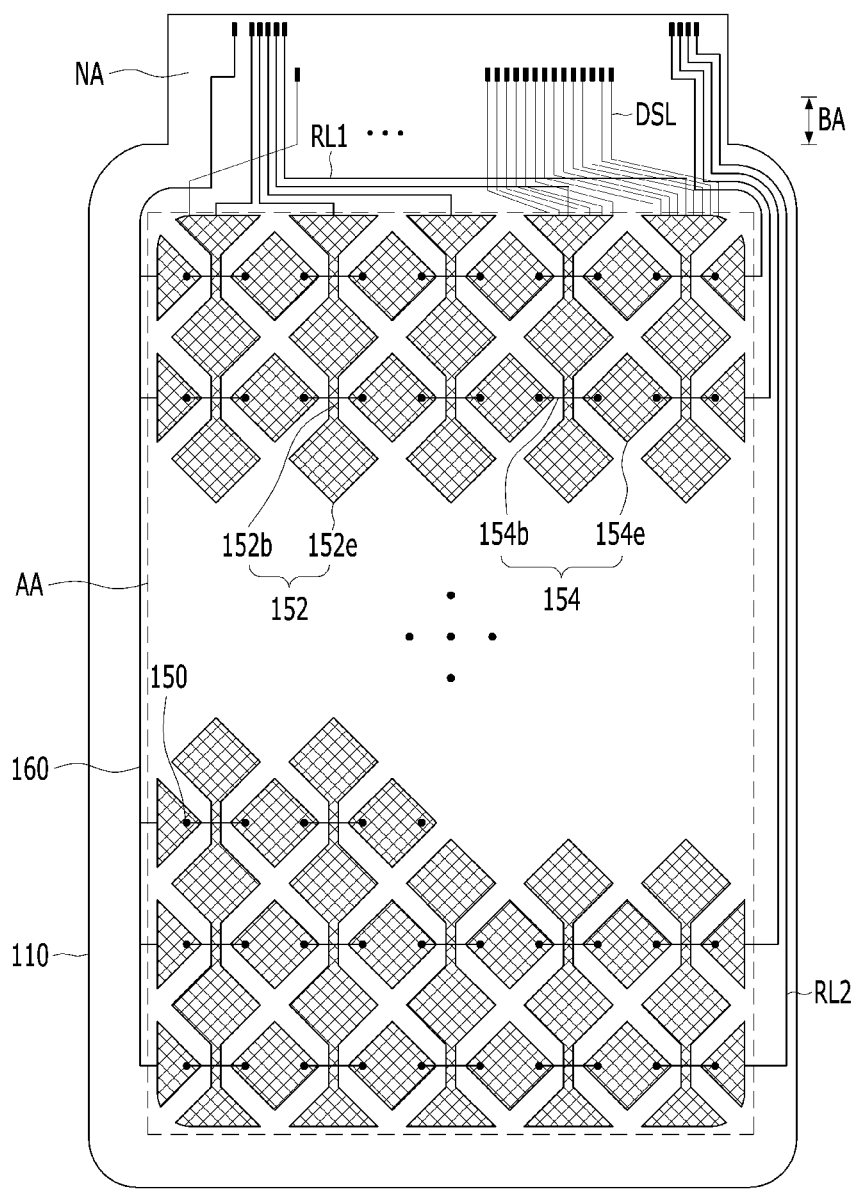
Figure 12B:
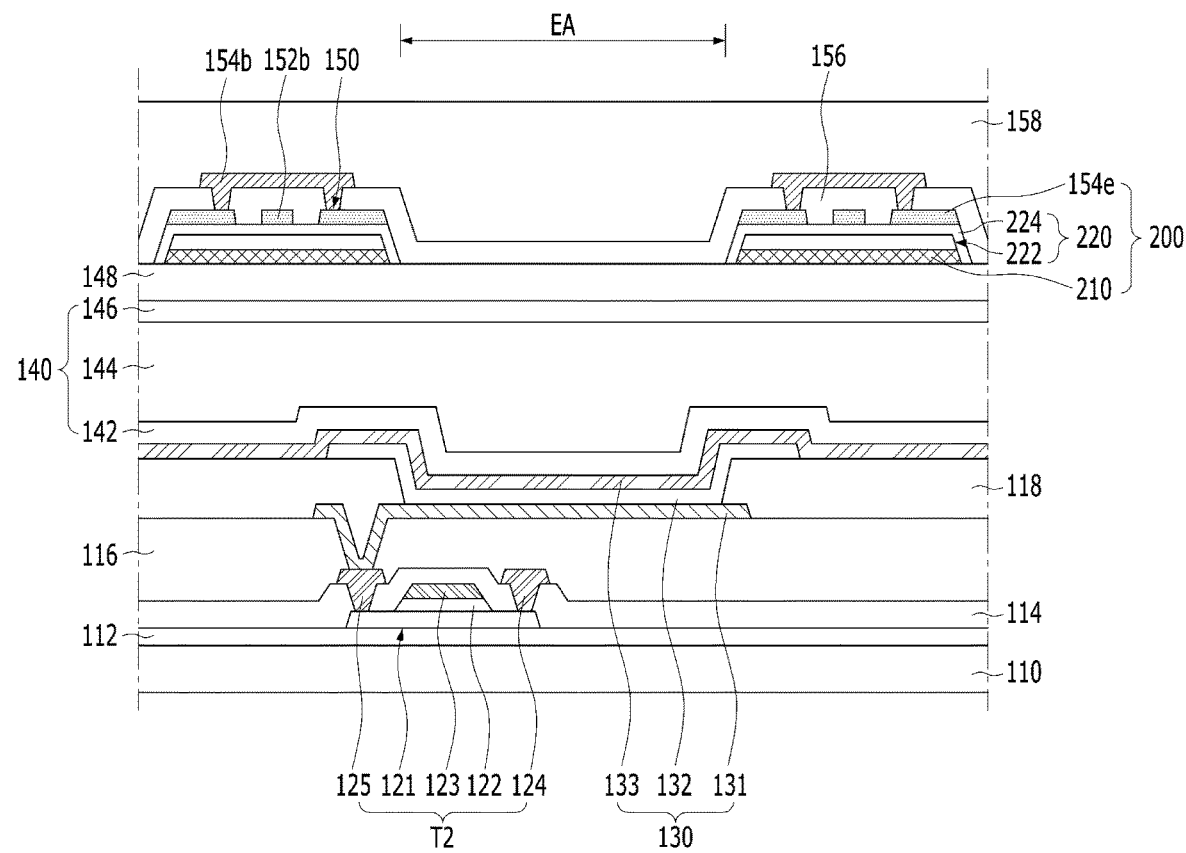
Figure 12C:
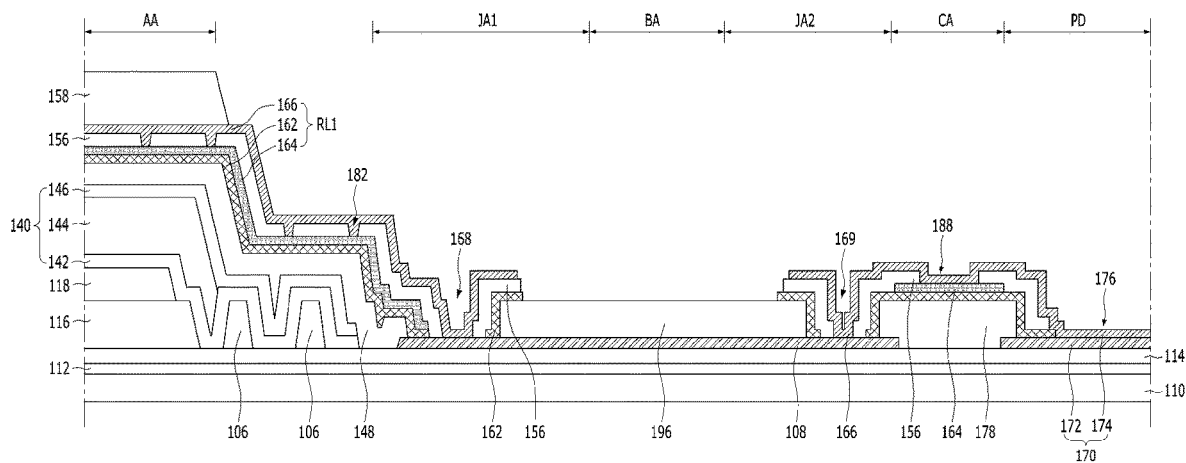

As shown in FIGS. 12A to 12C, the method of forming the touch display apparatus according to the embodiment of the present disclosure may include a step of forming a touch passivation layer 158 covering the second bridges 154b on the display area AA of the device substrate 110.

The touch passivation layer 158 may be formed of an insulating material. For example, the touch passivation layer 158 may include an inorganic insulating material, such as silicon oxide (SiO) and silicon nitride (SiN) or an organic insulating material.

As shown in FIGS. 2 to 4, the method of forming the touch display apparatus according to the embodiment of the present disclosure may include a step of coupling a signal transmission film 30 in which a touch driving circuit 20 is mounted, on the pad area PD of the device substrate 110.

Accordingly, the touch display apparatus according to the embodiment of the present disclosure may include the photo-electric device 200 between the encapsulating unit 140 covering the light-emitting devices 130 and the touch electrodes 152e and 154e of the touch sensor Cm, and the photo-electric routing line 160 electrically connecting the photo-electric device 20 to the charging controller 46 by extending along a surface of the encapsulating unit 140. Thus, the touch display apparatus according to the embodiment of the present disclosure may prevent or at least reduce the increase of the non-display area NA due to the photo-electric device 200, and charge the battery 44 using the electrical energy generated by the photo-electric device 200. Therefore, in the touch display apparatus according to the embodiment of the present disclosure, the using time without the external power connected may be improved without the deterioration of the resolution. And, in the touch display apparatus according to the embodiment of the present disclosure, the lifetime of the battery 44 may be increased.

The touch display apparatus according to the embodiment of the present disclosure is described that the photo-electric driver 40 is disposed in the touch driving circuit 20. However, in the touch display apparatus according to another embodiment of the present disclosure, the photo-electric driver 40 may be disposed outside the touch driving circuit 20. For example, in the touch display apparatus according to another embodiment of the present disclosure, the photo-electric driver 40 may be disposed on the non-display area NA of the device substrate 100.

The touch display apparatus according to the embodiment of the present disclosure is described that the photo-electric routing line 160 has the same structure as the lower electrode 210. However, in the touch display apparatus according to another embodiment of the present disclosure, the photo-electric line 160 may have the same structure as the first touch routing lines RL1. For example, the photo-electric line 160 may have a stacked structure of a first routing layer, a second routing layer and a third routing layer. The first routing layer of the photo-electric line 160 may have the same structure as the first routing layer 162 of each first touch routing line RL1. For example, the first routing layer of the photo-electric line 160 may have the same structure as the lower electrode 210. The second routing layer of the photo-electric line 160 may include the same material as the second routing layer 164 of each first touch routing line RL1. For example, the second routing layer of the photo-electric routing line 160 may be a transparent electrode made of a transparent conductive oxide, such as ITO, IZO and AZO. The third routing layer of the photo-electric routing line 160 may have the same structure as the third routing layer 166 of each first touch routing line RL1. For example, the third routing layer of the photo-electric routing line 160 may have the same structure as the second bridges 154*b*. The touch insulating layer 156 may extend between the second routing layer and the third routing layer of the photo-electric routing line 160. The third routing layer of the photo-electric routing line 160 may be electrically connected to the second routing layer of the photo-electric routing layer 160 by penetrating the touch insulating layer 156. Thus, in the touch display apparatus according to another embodiment of the present disclosure, the resistance of the photo-electric routing line 160 may be reduced. Therefore, in the touch display apparatus according to another embodiment of the present disclosure, the loss of the electrical energy due to the photo-electric routing line 160 may be reduced.

The touch display apparatus according to the embodiment of the present disclosure is described that the pixel driving circuit of each pixel area PA is configured by the switching thin film transistor T1, the driving thin film transistor T2 and the storage capacitor Cst. However, in the touch display apparatus according to another embodiment of the present disclosure, the pixel driving circuit of each pixel area PA may include at least three thin film transistors. For example, in the touch display apparatus according to another embodiment of the present disclosure, the pixel driving circuit of each pixel area PA may further comprise an initializing thin film transistor to initialize the storage capacitor Cst according to the scan signal. The touch display apparatus according to another embodiment of the present disclosure may include a plurality of the storage capacitor Cst.

The touch display apparatus according to the embodiment of the present disclosure is described that the light emitted from the light-emitting device 130 of each pixel area PA displays a color different from the light emitted from the light-emitting device 130 of adjacent pixel area PA. However, in the touch display apparatus according to another embodiment of the present disclosure, the light-emitting device 130 of each pixel area PA may emit the light displaying the same color, and the color realized by each pixel area PA may be changed by a color filter. For example, in the touch display apparatus according to another embodiment of the present disclosure, the light emitted from the light-emitting device 130 of each pixel area PA may display white. In the touch display apparatus according to another embodiment of the present disclosure, the light-emitting stack 132 of each pixel area PA may be connected to the light-emitting stack 132 of adjacent pixel area PA. In the touch display apparatus according to another embodiment of the present disclosure, the light-emitting stack 132 of each pixel area PA may include a plurality of emission material layer. For example, in the touch display apparatus according to another embodiment of the preset disclosure, the light-emitting stack 132 of each pixel area PA may have a stacked structure of a first emission material layer generating blue light and a second emission material layer generating yellow-green light.

The touch display apparatus according to the embodiment of the present disclosure is described that each of the lower electrode 210, the first routing layer 162, the second bridges 154*b* and the third routing layer 166 has a multi-layer structure. However, in the touch display apparatus according to another embodiment of the present disclosure, the lower electrode 210, the first routing layer 162, the second bridges 154*b* and the third routing layer 166 may have a single-layer structure. For example, in the touch display apparatus according to another embodiment of the present disclosure, each of the first touch routing line RL1 and each of the second touch routing line may have a three-layer structure.

Figure 13:
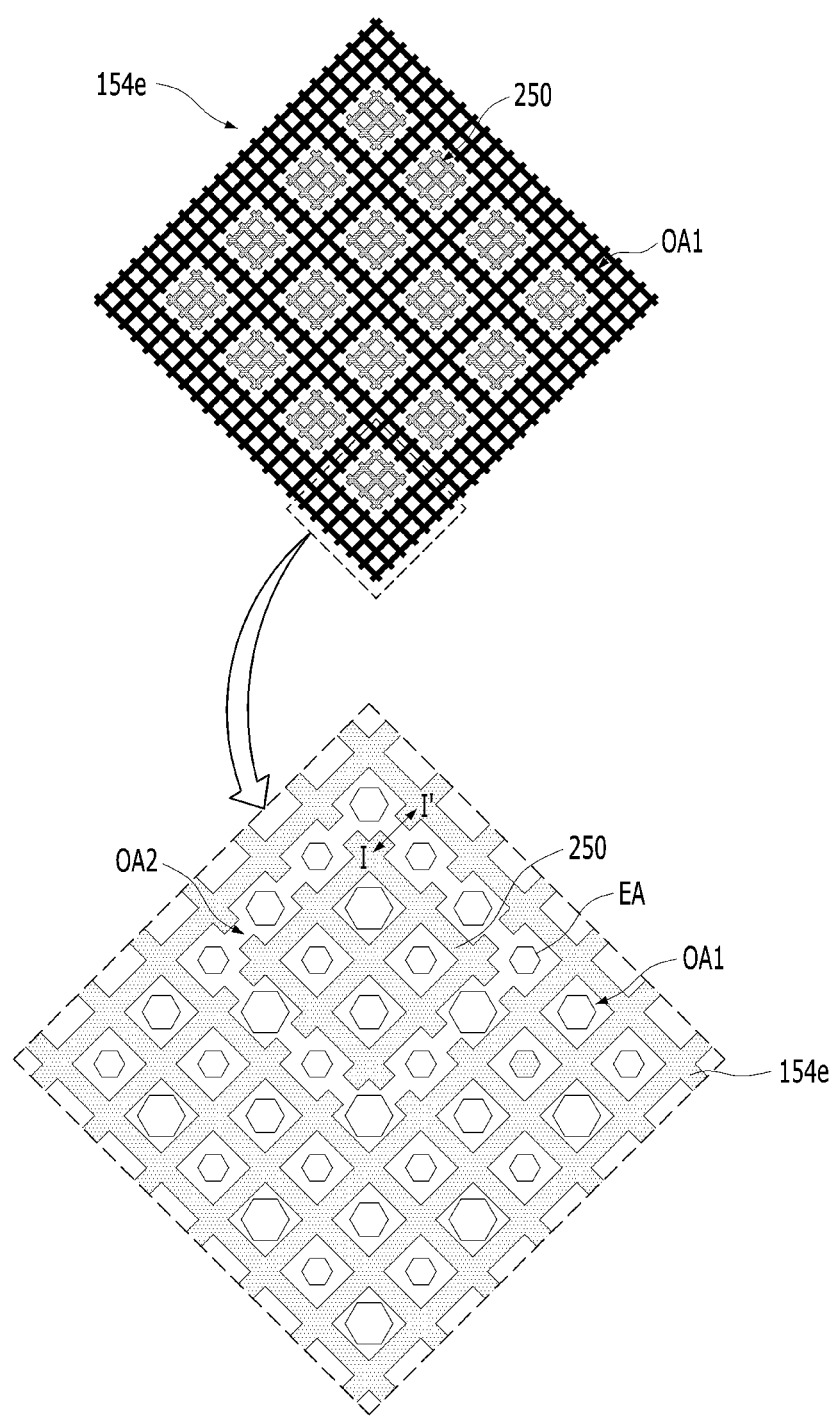
FIGS. 13, 15 to 19 and 21 are views showing the touch display apparatus according to another embodiment of the present disclosure.
Figure 14:
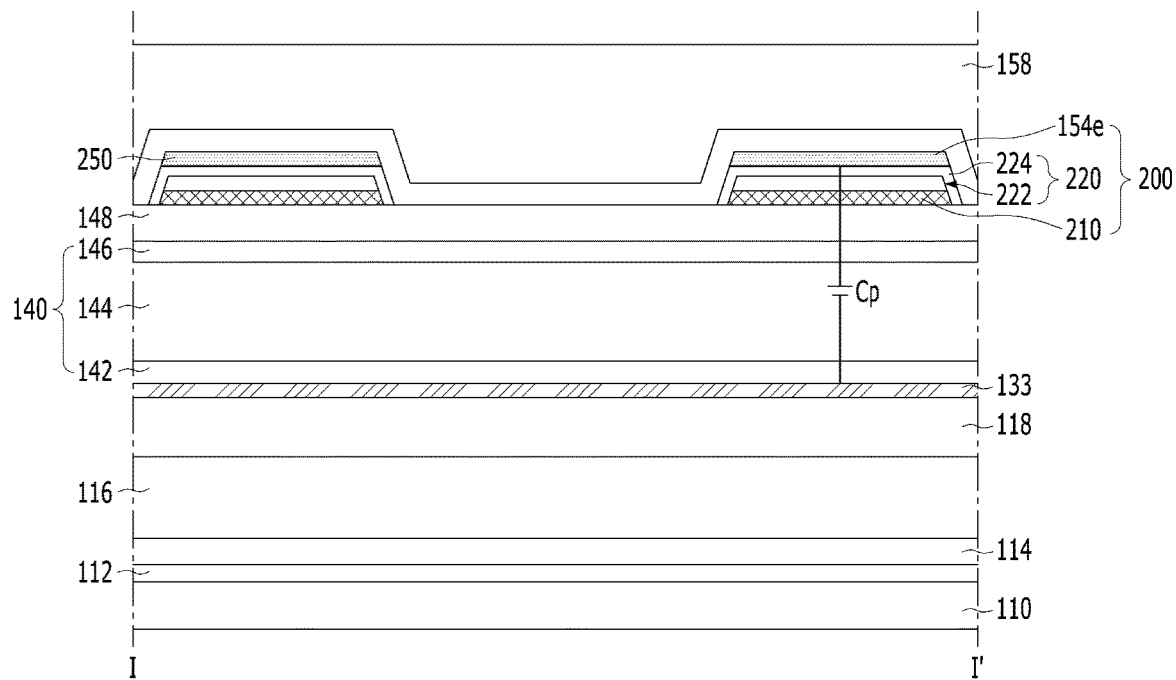
FIG. 14 is a view taken along I-I' of FIG. 13 according to the other embodiment.
Figure 16:
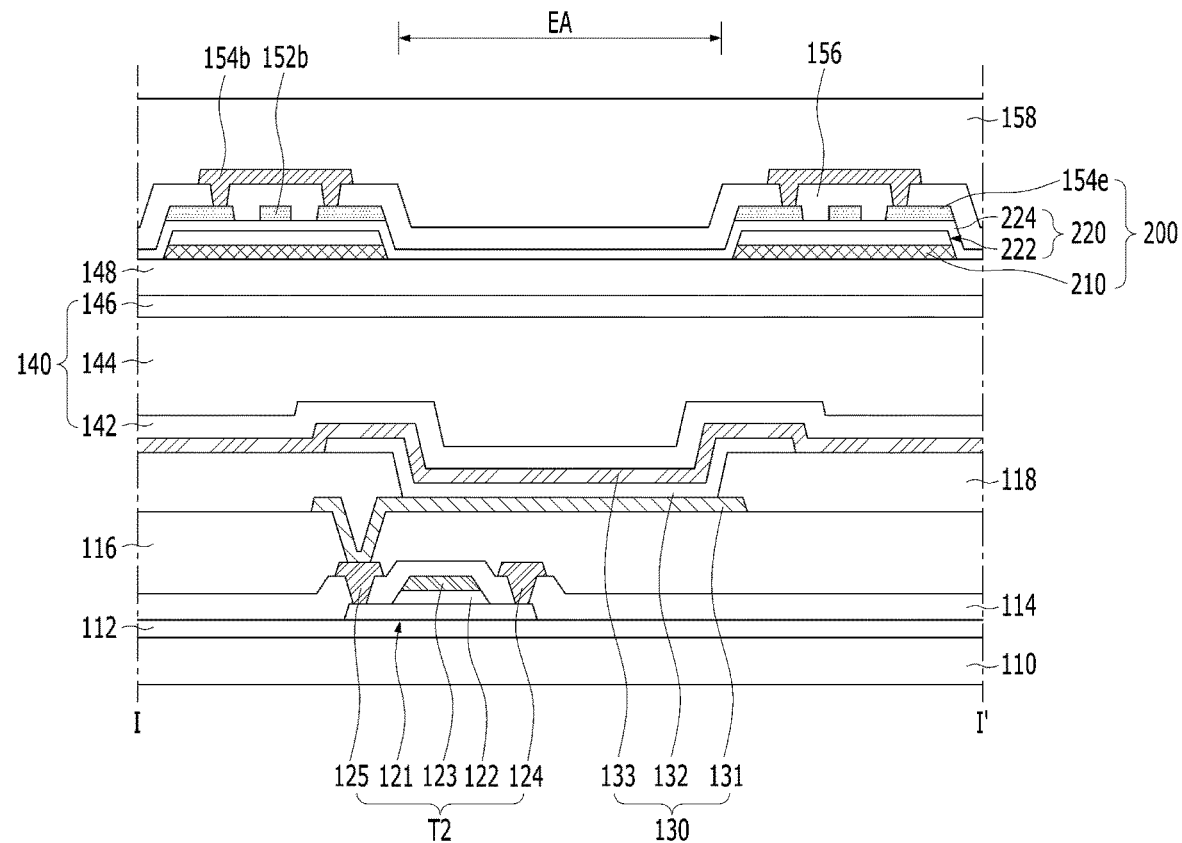

As shown in FIGS. 13 and 16, in the touch display apparatus according to another embodiment of the present disclosure, some of the first touch electrodes and the second touch electrodes 154*e* may include a dummy conductive layer 250. The dummy conductive layer 250 may be spaced away from the corresponding first touch electrode or the corresponding second touch electrode 154*e*. For example, some of the first touch electrodes and the second touch electrodes 154*e* may include a first opening OA1 overlapping with the emission area EA of each pixel area and a second opening OA2 in which the dummy conductive layer 250 is disposed. The dummy conductive layer 250 may be disposed outside the emission areas EA. For example, the dummy conductive layer 250 may have a mesh shape in the second opening OA2 of the corresponding first touch electrode or the corresponding second touch electrode 154*e*. Thus, in the touch display apparatus according to another embodiment of the present disclosure, the decrease in the light extraction efficiency and the luminance due to the dummy conductive layer 250 may be prevented or at least reduced.

The dummy conductive layer 250 may include the same material as the first touch electrodes and the second touch electrodes 154*e*. For example, the dummy conductive layer 250 may be a transparent electrode made of a transparent conductive oxide, such as ITO, IZO and AZO. The dummy conductive layer 250 may be disposed on the same layer as the first touch electrodes and the second touch electrodes 154*e*. For example, the dummy conductive layer 250 may be in direct contact with the upper surface of the light-absorbing layer 220.

The dummy conductive layer 250 may be in a floating state. For example, the dummy conductive layer 250 may be not connected to the display signal line, the touch routing lines and the photo-electric routing line. Thus, in the touch display apparatus according to another embodiment of the present disclosure, a parasitic capacitor Cp may be not formed between the dummy conductive layer 250 and the second emission electrode 144 of the corresponding pixel area. That is, in the touch display apparatus according to another embodiment of the present disclosure, capacitance of the parasitic capacitor Cp formed between the first touch electrodes and the second emission electrode 133 and between the second touch electrodes 154*e* and the second emission electrode 133 may be reduced. Therefore, in the touch display apparatus according to another embodiment of the present disclosure, the touch sensitivity may be improved.

Figure 15:
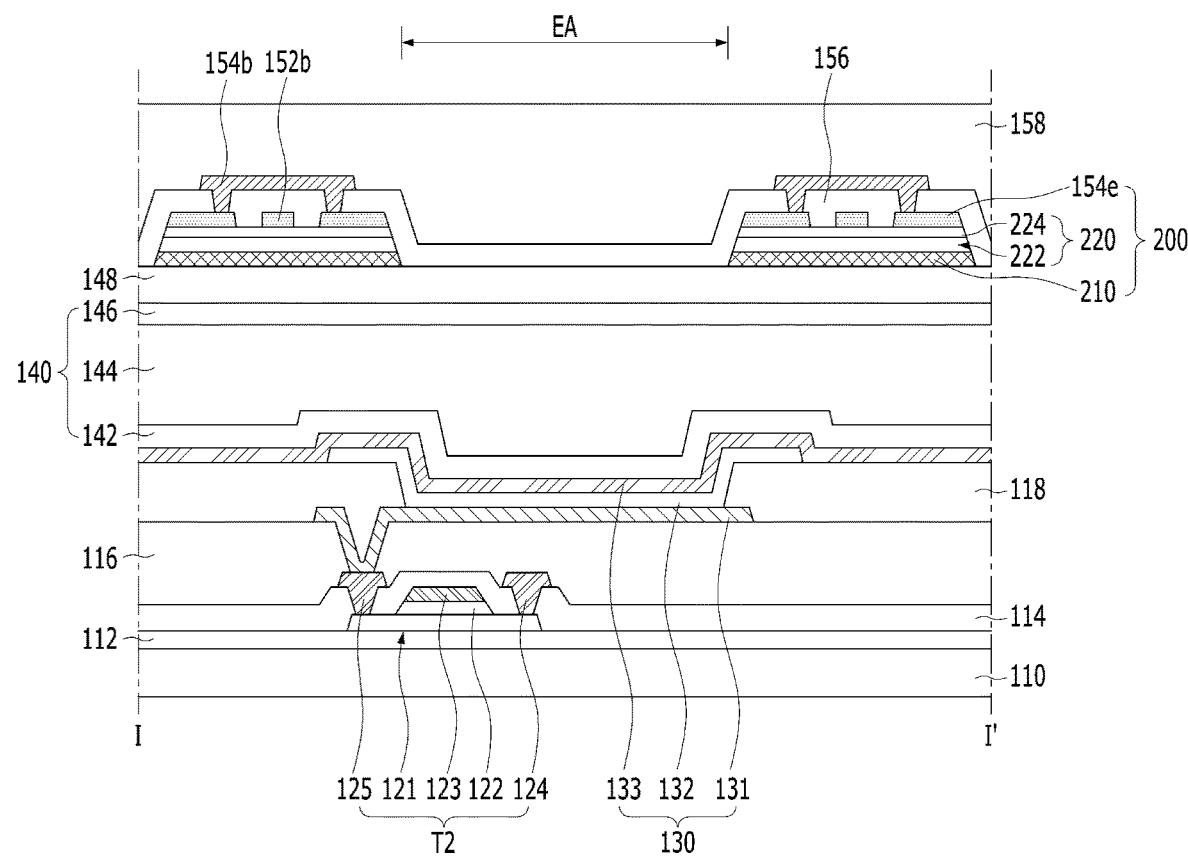

The touch display apparatus according to the embodiment of the present disclosure is described that the barrier layer 224 covers a side of the semiconductor stack 222 and a side of the lower electrode 210. However, in the touch display apparatus according to another embodiment of the present disclosure, the semiconductor stack 222 and the barrier layer 224 may be formed by a single mask pattern. For example, in the touch display apparatus according to another embodiment of the present disclosure, the barrier layer 224 may expose a side of the semiconductor stack 222 and a side of the lower electrode 210, as shown in FIG. 15. Thus, in the touch display apparatus according to another embodiment of the present disclosure, the process efficiency may be improved.

The touch display apparatus according to the embodiment of the present disclosure is described that the semiconductor stack 222 and the barrier layer 224 overlaps the lower electrode 210. However, in the touch display apparatus according to another embodiment of the present disclosure, only the semiconductor stack 222 may overlap the lower electrode 210. For example, in the touch display apparatus according to another embodiment of the present disclosure, the barrier layer 224 may extend on the emission area EA of each pixel area, as shown in FIG. 16.

Figure 17:
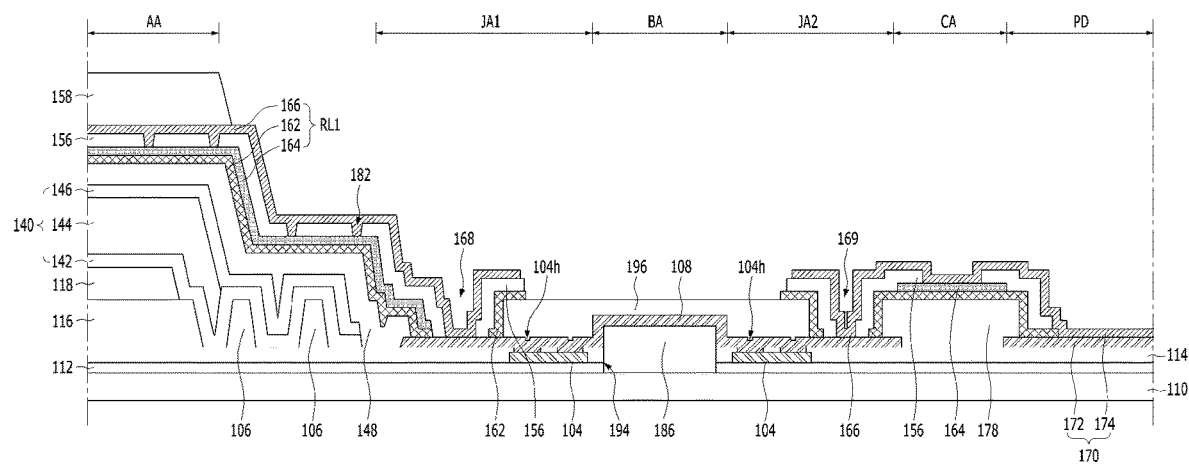

The touch display apparatus according to the embodiment of the present disclosure is described that the device buffer layer 112 and the interlayer insulating layer 114 are stacked on the bending area BA of the device substrate 110. However, in the touch display apparatus according to another embodiment of the present disclosure, all of an inorganic insulating layer disposed on the bending area BA of the device substrate 110 may be removed. For example, the touch display apparatus according to another embodiment of the present disclosure may include a bending aperture 194 penetrating the device buffer layer 112 and the interlayer insulating layer 114 on the bending area BA and a bending organic layer 186 in the bending aperture 194, as shown in FIG. 17. The bending organic layer 186 may include an organic insulating material, such as epoxy resin and acryl resin. Thus, in the touch display apparatus according to another embodiment of the present disclosure, the bending stress may be effectively relieved. Therefore, in the touch display apparatus according to another embodiment of the present disclosure, the formation and the propagation of the crack due to the bending stress may be effectively prevented or at least reduced.

In the touch display apparatus according to another embodiment of the present disclosure, auxiliary jumping electrodes 104 connected to each jumping electrode 108 may be disposed on the first jumping area JA1 and the second jumping area JA2, as shown in FIG. 17. The auxiliary jumping electrodes 104 may include the same material as the gate electrode of each driving thin film transistor. The auxiliary jumping electrode 104 may be disposed on the same layer as the gate electrode of each driving thin film transistor. For example, the auxiliary jumping electrodes 104 may be disposed between the device buffer layer 112 and the interlayer insulating layer 114. The interlayer insulating layer 114 may include auxiliary jumping contact holes 104h exposing a portion of each auxiliary jumping electrode 104 on the first jumping area JA1 and a portion of each auxiliary jumping electrode 104 on the second jumping area JA2. Each of the jumping electrodes 108 may be electrically connected to the corresponding auxiliary jumping electrode 104 through the auxiliary jumping contact holes 104h.

Figure 18:
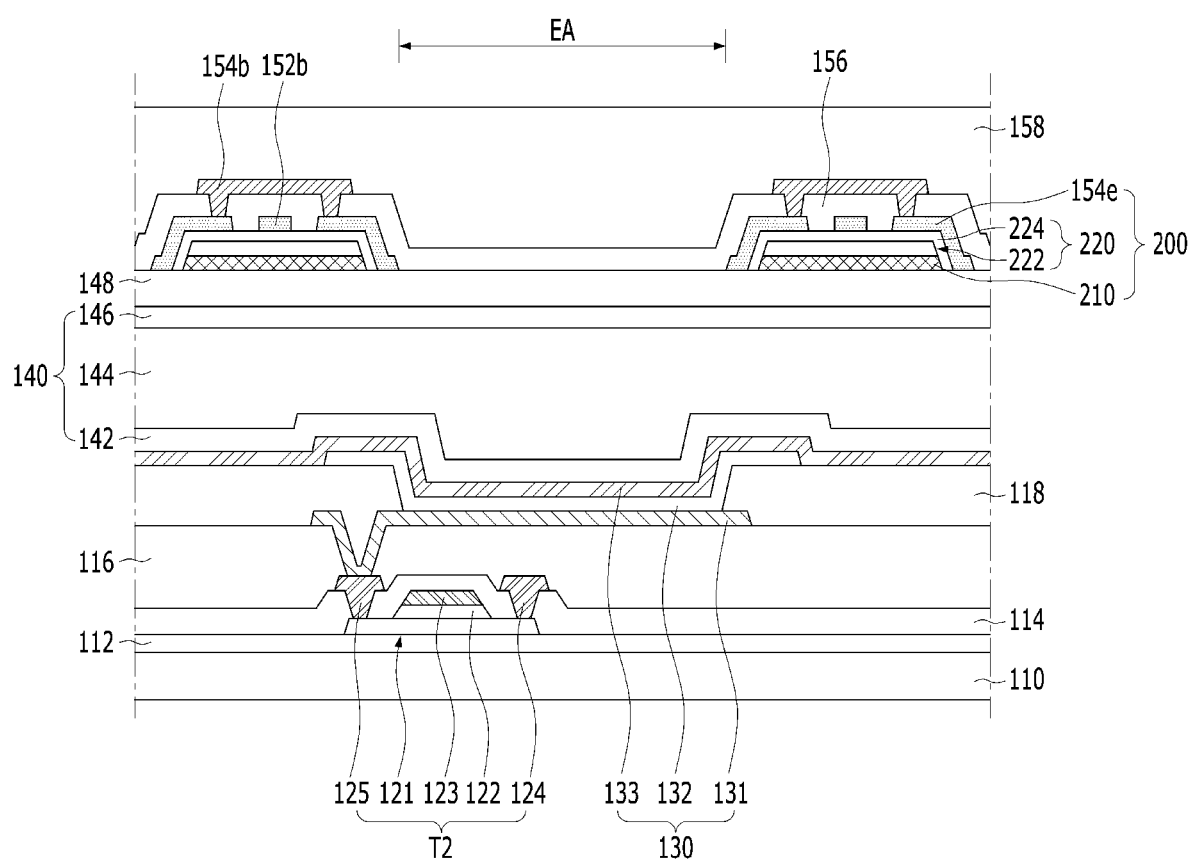

The touch display apparatus according to the embodiment of the present disclosure is described that the first touch electrodes 152e and the second touch electrodes 154e are disposed only on the upper surface of the light-absorbing layer 220. However, in the touch display apparatus according to another embodiment of the present disclosure, the first touch electrodes and the second touch electrodes 154e may extend on a side of the lower electrode 210 along the barrier layer 224, as shown in FIG. 18. Thus, in the touch display apparatus according to another embodiment of the present disclosure, the touch location of the user and/or the tool may be detected, accurately.

Figure 19:
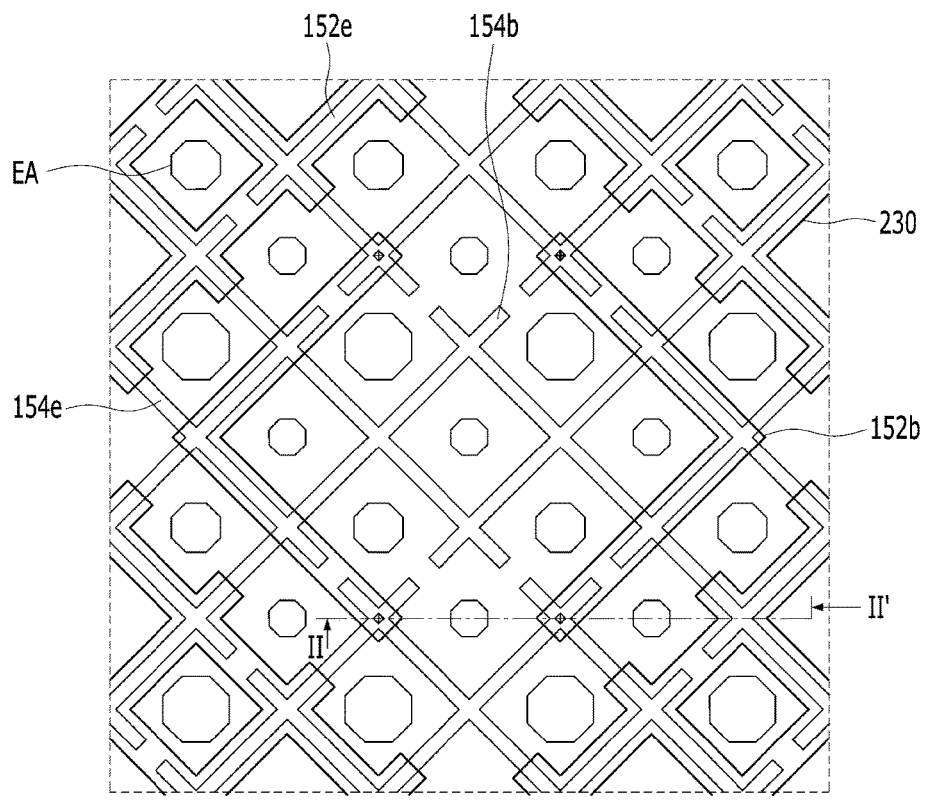
Figure 20:
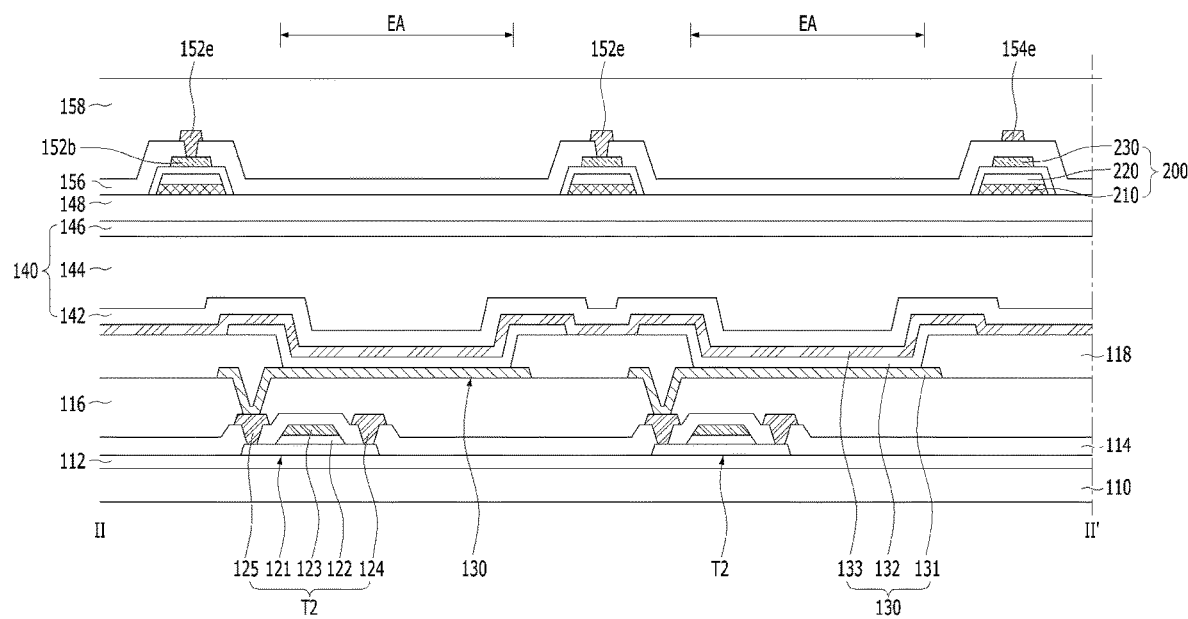
FIG. 20 is a view taken along II-II' of FIG. 19 according to the other embodiment.
Figure 21:
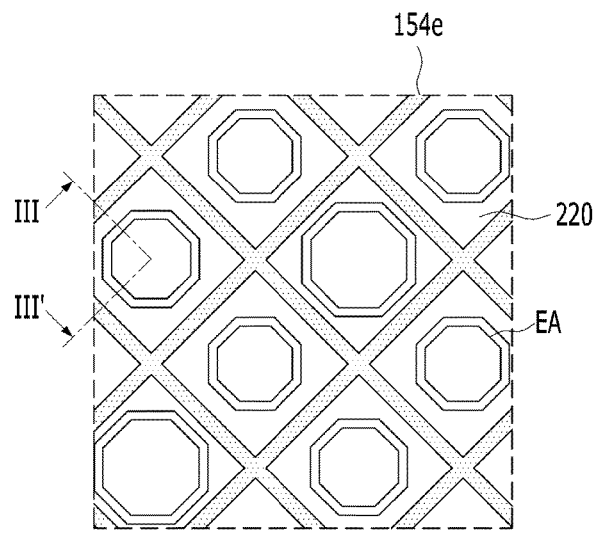
Figure 22:
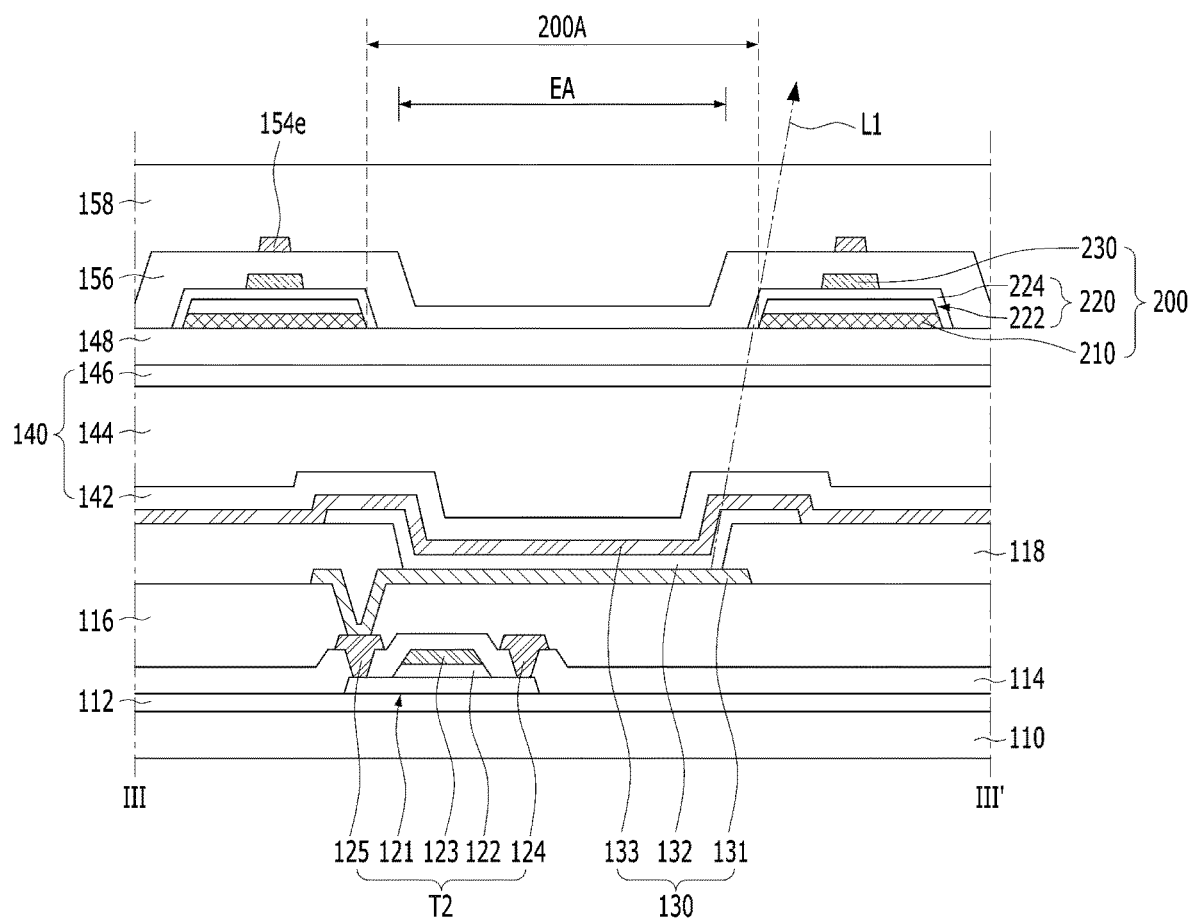
FIG. 22 is a view taken along of FIG. 21 according to the other embodiment.

The touch display apparatus according to the embodiment of the present disclosure is described that the first touch electrodes 152e and the second touch electrodes 154e are covered by the touch insulating layer 156. However, in the touch display apparatus according to another embodiment of the present disclosure, the photo-electric device 200 between the touch buffer layer 148 and the touch insulating layer 156 may have a stacked structure of the lower electrode 210, the light-absorbing layer 220 and an upper electrode 230, and the first touch electrodes 152e and the second touch electrodes 154e may be disposed on the touch insulating layer 156, as shown in FIGS. 19 and 20.

The upper electrode 230 may include a conductive material. The upper electrode 230 may have a material having high transmittance. For example, the upper electrode 230 may be a transparent electrode made of a transparent conductive oxide, such as ITO, IZO and AZO. The upper electrode 230 may overlap the bank insulating layer 118. For example, the upper electrode 230 may overlap the first touch electrodes 152e and the second touch electrodes 154e. The upper electrode 230 may have a mesh shape.

The first touch electrodes 152e and the second touch electrodes 154e may be formed of a transparent conductive material. For example, the first touch electrodes 152e and the second touch electrodes 154e may be a transparent electrode made of a transparent conductive oxide, such as ITO, IZO and AZO. Thus, in the touch display apparatus according to another embodiment of the present disclosure, the light passing through the first touch electrodes 152e and the second touch electrodes 154e may be incident on the photo-electric device 200.

The first touch electrodes 152e may be connected in the first direction by the first bridges 152b. The first bridges 152b may be disposed on a layer different from the first touch electrodes 152e. For example, the first bridges 152b may be disposed between the touch buffer layer 148 and the touch insulating layer 156. Each of the first touch electrodes 152e may be in direct contact with one of the first bridges 152b by penetrating the touch insulating layer 156.

The first bridges 152b may be disposed on the same layer as the upper electrode 230. The first bridges 152b may include the same material as the upper electrode 230. For example, the first bridges 152b may be formed simultaneously with the upper electrode 230. Thus, in the touch display apparatus according to another embodiment of the present disclosure, a process of forming the upper electrode 230 and the first bridges 152b may be simplified. The first bridges 152b may be insulated from the upper electrode 230. For example, the upper electrode 230 may be spaced away from the first bridges 152b.

The lower electrode 210 and the light-absorbing layer 220 may extend between the touch buffer layer 148 and the first bridges 152b. For example, the light-absorbing layer 220 may be disposed between the touch buffer layer 148 and the upper electrode 230 and between the touch buffer layer 148 and the first bridges 152b. Thus, in the touch display apparatus according to another embodiment of the present disclosure, a size of the light-absorbing layer 220 may be larger than a size of the upper electrode 230. Therefore, in the touch display apparatus according to another embodiment of the present disclosure, the photo-electric conversion efficiency may be improved.

The second touch electrodes 154e may be connected in the second direction by the second bridges 154b. The second direction may be perpendicular to the first direction. For example, each of the second bridges 154b may cross one of the first bridges 152b. The upper electrode 230 may be disposed outside the first bridges 152b and the second bridges 154b. Thus, in the touch display apparatus according to another embodiment of the present disclosure, the decrease of the touch sensitivity due to the upper electrode 230 may be prevented or at least reduced.

The second bridges 154b may be disposed on the same layer as the first touch electrodes 152e and the second touch electrodes 154e. For example, the second bridges 154b may be disposed on the touch insulating layer 156. The second bridges 154b may include the same material as the first touch electrodes 152e and the second touch electrodes 154e. For example, the second bridges 154b may be formed simultaneously with the first touch electrodes 152e and the second touch electrodes 154e. Each of the second bridges 154b may be in direct contact with the corresponding second touch electrodes 154e.

The second routing layer of each first touch routing line may have the same structure as the upper electrode 230 and the first bridges 152b. For example, the second routing layer of each first touch routing line may be a transparent electrode made of a transparent conductive oxide, such as ITO, IZO and AZO. The second routing layer of each first touch routing line may be formed simultaneously with the upper electrode 230 and the first bridges 152b. The third routing layer of each first touch routing line may include the same material as the first touch electrodes 152e, the second touch electrodes 154e and the second bridges 154b. For example, the third routing layer of each first touch routing line may be a transparent electrode made of a transparent conductive oxide, such as ITO, IZO and AZO.

In the touch display apparatus according to another embodiment of the present disclosure, each opening of the light-absorbing layer 220 may have a shape corresponding to the emission area EA of the corresponding pixel area. For example, in the touch display apparatus according to another embodiment of the present disclosure, each opening 200A of the light-absorbing layer 220 may have a shape extending along an edge of the corresponding emission area EA. The center of each opening 200A may be the same as the center of the corresponding emission area EA. Each opening 200A of the light-absorbing layer 220 may have a size larger than the emission area EA of the corresponding pixel area. For example, a space between each opening 200A and the corresponding emission area EA may have a constant distance. The light-absorbing layer 220 may include a region between the corresponding touch electrode 154e and the corresponding emission area EA. Thus, in touch display apparatus according to another embodiment of the present disclosure, the amount of the light being incident on the light-absorbing layer 220 may be increased. And, in the touch display apparatus according to another embodiment of the present disclosure, some of the light L1 emitted from each emission area EA in an oblique direction may be emitted to the outside passing through the corresponding opening 200A of the light-absorbing layer 220. That is, in the touch display apparatus according to another embodiment of the present disclosure, an area in which light is emitted from each pixel area may be recognized to be larger than the emission area EA of the corresponding pixel area. Therefore, in the touch display apparatus according to another embodiment of the present disclosure, the luminance and the viewing angle of color in each pixel area may be improved.

In the result, the touch display apparatus according to the embodiments of the present disclosure may include the light-emitting device, the touch sensor on the encapsulating unit covering the light-emitting device, and the photo-electric device between the encapsulating unit and the touch sensor. Thus, in the touch display apparatus according to the embodiments of the present disclosure, the electrical energy generated by the photo-electric device may be used as power required to drive the light-emitting device and/or the touch sensor. And, in the touch display apparatus according to the embodiments of the present disclosure, the increase in the non-display area due to the photo-electric device may be prevented or at least reduced. Thereby, in the touch display apparatus according to the embodiments of the present disclosure, the using time without the external power source connected may be increased without the deterioration of the resolution. That is, in the touch display apparatus according to the embodiments of the present disclosure, the lifetime of the battery built in a portable device may be improved.

What is claimed is:

1. A touch display apparatus comprising:
   a light-emitting device on a device substrate;
   an encapsulating unit on the light-emitting device, the encapsulating unit including at least one organic encapsulating layer and at least one inorganic encapsulating layer;
   a touch sensor on the encapsulating unit, the touch sensor including touch electrodes and bridges connecting the touch electrodes; and
   a photo-electric device between the encapsulating unit and the touch sensor, the photo-electric device including a light-absorbing layer that overlaps the touch sensor,
   wherein at least one of the touch electrodes and the bridges is in contact with the light-absorbing layer of the photo-electric device.

2. The touch display apparatus according to claim 1, wherein the touch electrodes include first touch electrodes and second touch electrodes, which are disposed on the encapsulating unit,
   wherein the bridges include first bridges connecting the first touch electrodes, and second bridges connecting the second touch electrodes,
   wherein the photo-electric device further includes a lower electrode between the encapsulating unit and the light-absorbing layer,
   wherein the lower electrode overlaps the first touch electrodes and the second touch electrodes, and
   wherein the first touch electrodes and the second touch electrodes of the touch sensor are in contact with the light-absorbing layer of the photo-electric device, such that the first touch electrodes and the second touch electrode function as an upper electrode of the photo-electric device.

3. The touch display apparatus according to claim 2, wherein the first touch electrodes and the second touch electrodes have a transmittance that is greater than a transmittance of the lower electrode.

4. The touch display apparatus according to claim 2, wherein the first bridges and the second bridges overlap the lower electrode.

5. The touch display apparatus according to claim 2, wherein the light-emitting device is disposed on an emission area of the device substrate, and
   wherein each of the first touch electrodes, the second touch electrodes, and the lower electrode has a mesh shape including an opening exposing the emission area.

6. The touch display apparatus according to claim 5, wherein the light-absorbing layer includes a semiconductor stack on the lower electrode and a barrier layer on the semiconductor stack.

7. The touch display apparatus according to claim 6, wherein the barrier layer covers a side of the lower electrode.

8. The touch display apparatus according to claim 6, wherein the semiconductor stack has a mesh shape overlapping with the lower electrode, the first touch electrodes, and the second touch electrodes.

9. The touch display apparatus according to claim 2, further comprising:

first touch routing lines extending from the first touch electrodes;

second touch routing lines extending from the second touch electrodes; and a photo-electric routing line extending from the lower electrode, wherein each of the first touch routing lines, the second touch routing lines, and the photo-electric routing line is disposed on the at least one inorganic encapsulating layer covering a side of the at least one organic encapsulating layer.

10. The touch display apparatus according to claim 9, wherein at least one of the first touch routing lines and the second touch routing lines has a stacked structure of a first routing layer, a second routing layer, and a third routing layer, wherein the first routing layer includes a same material as the lower electrode, wherein the second routing layer includes a same material as the first bridges, and wherein the third routing layer includes a same material as the second bridges.

11. The touch display apparatus according to claim 10, wherein the photo-electric routing line has a single-layer structure made of the first routing layer or a multi-layer structure in which at least one of the second routing layer and the third routing layer is disposed on the first routing layer.

12. The touch display apparatus according to claim 10, further comprising:

a touch insulating layer on the second routing layer; and a routing contact hole penetrating the touch insulating layer, the routing contact hole partially exposing the second routing layer, wherein the third routing layer is connected to the second routing layer through the routing contact hole.

13. A touch display apparatus comprising:

a bank insulating layer on a device substrate, the bank insulating layer defining emission areas;

light-emitting devices on the emission areas of the device substrate;

an encapsulating unit on the device substrate, the encapsulating unit covering the bank insulating layer and the light-emitting devices;

a photo-electric device including a lower electrode, a light-absorbing layer, and an upper electrode, which are sequentially stacked on the encapsulating unit, the photo-electric device overlapping the bank insulating layer;

a touch insulating layer on the photo-electric device;

first touch electrodes disposed side by side on the touch insulating layer; and first bridges connecting each of the first touch electrodes to other first touch electrodes adjacent in a first direction, wherein the first bridges are disposed on a same layer as the upper electrode of the photo-electric device.

14. The touch display apparatus according to claim 13, wherein the first bridges include a same material as the upper electrode.

15. The touch display apparatus according to claim 13, further comprising:

second touch electrodes disposed between the first touch electrodes; and second bridges connecting each of the second touch electrodes to other second touch electrodes adjacent in a second direction, the second direction perpendicular to the first direction, wherein the second touch electrodes and the second bridges are disposed on a same layer as the first touch electrodes.

16. The touch display apparatus according to claim 15, wherein the upper electrode is disposed outside the first bridges and the second bridges, and wherein the first touch electrodes and the second touch electrodes overlap the upper electrode.

17. The touch display apparatus according to claim 13, wherein the light-absorbing layer includes openings overlapping with the emission areas, and wherein each of the openings has a shape extending along an edge of a corresponding emission area.

18. The touch display apparatus according to claim 17, wherein a center of each opening is a same as a center of a corresponding emission area.

19. The touch display apparatus according to claim 13, wherein the light-absorbing layer includes a region between the upper electrode and the emission areas.

20. The touch display apparatus according to claim 13, wherein the lower electrode and the light-absorbing layer extend between the encapsulating unit and the first bridges.

* * * * *